United States Patent
Taketani

(10) Patent No.: US 8,264,892 B2
(45) Date of Patent: Sep. 11, 2012

(54) SEMICONDUCTOR DEVICE AND METHOD OF CONTROLLING THE SAME

(75) Inventor: Hiroaki Taketani, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 191 days.

(21) Appl. No.: 12/888,085

(22) Filed: Sep. 22, 2010

(65) Prior Publication Data

US 2011/0069564 A1    Mar. 24, 2011

(30) Foreign Application Priority Data

Sep. 24, 2009    (JP) .................................. 2009-218819

(51) Int. Cl.
*G11C 7/00*    (2006.01)
(52) U.S. Cl. .................... 365/189.011; 365/63; 257/288
(58) Field of Classification Search ........... 365/189.011, 365/63; 257/288
See application file for complete search history.

(56) References Cited

U.S. PATENT DOCUMENTS

| | | | | |
|---|---|---|---|---|
| 4,264,965 A | * | 4/1981 | Onishi | ..................... 365/210.14 |
| 7,612,397 B2 | * | 11/2009 | Ueda et al. | ..................... 257/296 |
| 2008/0130366 A1 | * | 6/2008 | Ueda et al. | ............... 365/185.13 |

FOREIGN PATENT DOCUMENTS

| | | |
|---|---|---|
| JP | 2003-68877 | 3/2003 |
| JP | 2005-277377 | 10/2005 |
| JP | 2008-72051 | 3/2008 |
| WO | WO-2005/122244 | 12/2005 |
| WO | WO-2007/028583 | 3/2007 |

* cited by examiner

*Primary Examiner* — Tuan T. Nguyen
(74) *Attorney, Agent, or Firm* — Morrison & Foerster LLP

(57) ABSTRACT

A semiconductor device may include, but is not limited to: a first insulating film; first and second impurity layers on the first insulating film; a semiconductor layer on the first insulating film; a second insulating film covering the semiconductor layer; a first electrode on the second insulating film over the semiconductor layer; and a second electrode on the second insulating film over the semiconductor layer. The first and second impurity layers have a first conductive type. The first impurity layer is separated from the second impurity layer. The semiconductor layer is positioned between the first and second impurity layers. The semiconductor layer has a second conductive type which is different from the first conductive type. The first electrode is electrically insulated from the second electrode. The second electrode at least partially overlaps the first electrode in plan view.

17 Claims, 28 Drawing Sheets

FIG. 24A
FIG. 24B
FIG. 24C
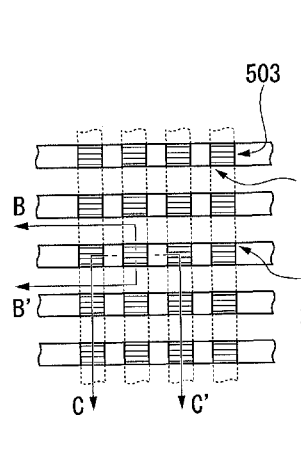
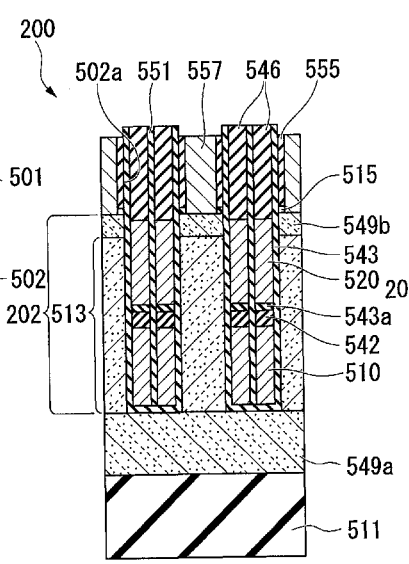
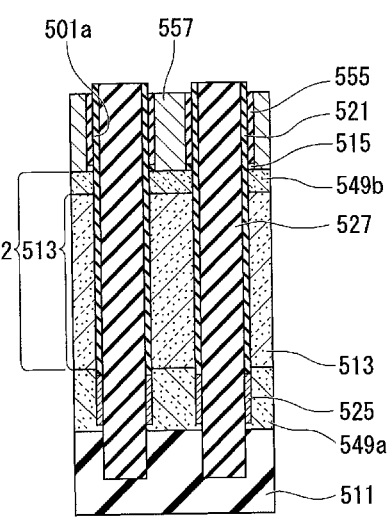

FIG. 29A
FIG. 29B
FIG. 29C
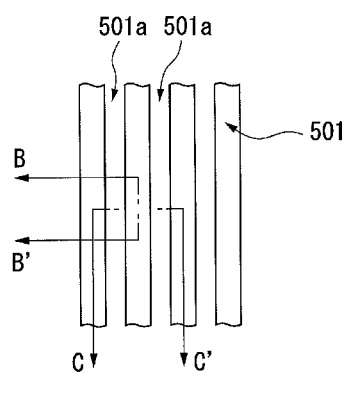
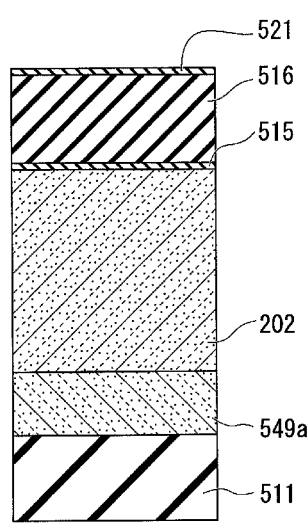
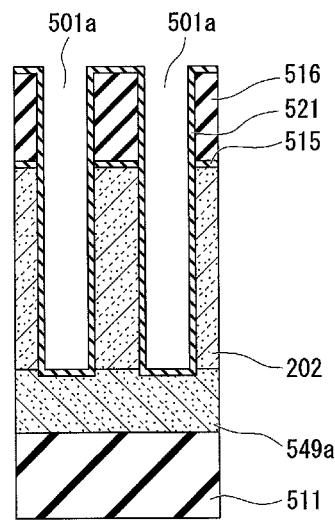

FIG. 35A
FIG. 35B
FIG. 35C
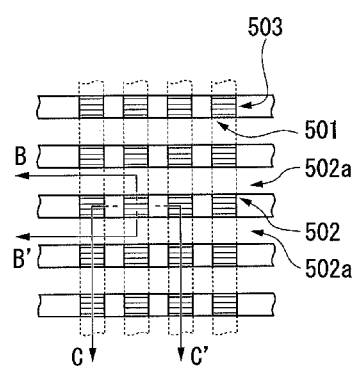
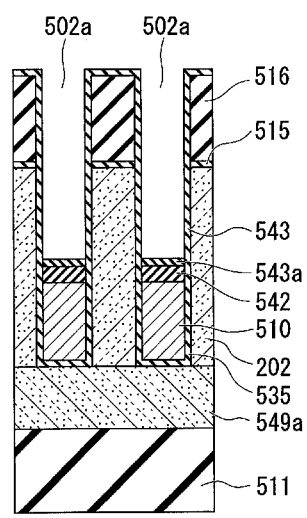
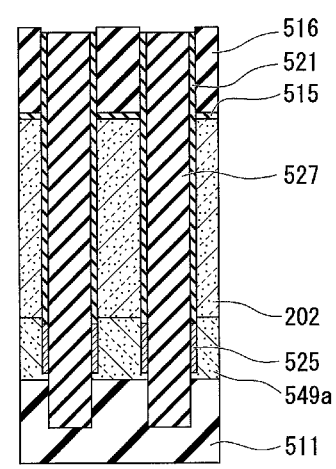

FIG. 36A
FIG. 36B
FIG. 36C
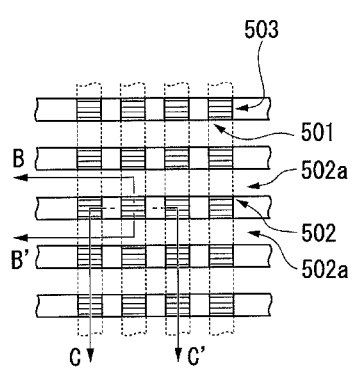
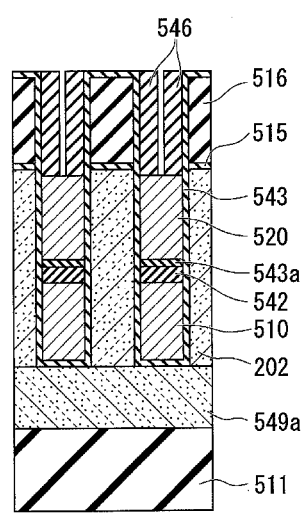
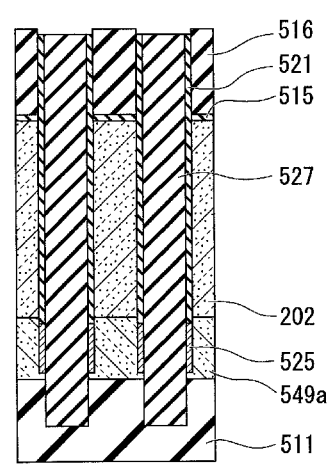

FIG. 37A
FIG. 37B
FIG. 37C
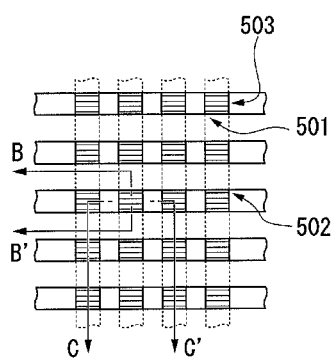
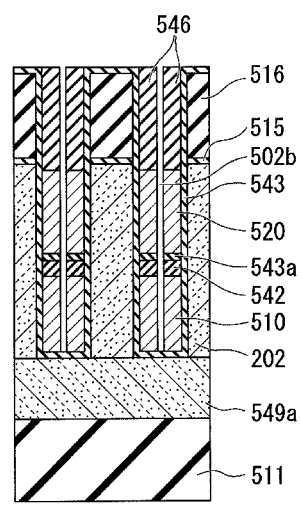
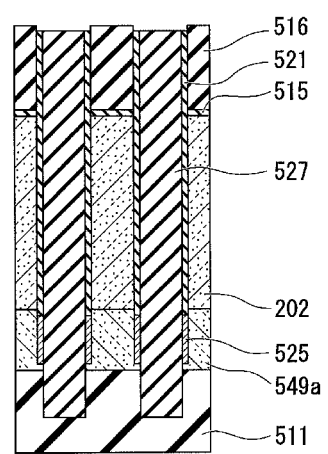

FIG. 39A    FIG. 39B    FIG. 39C
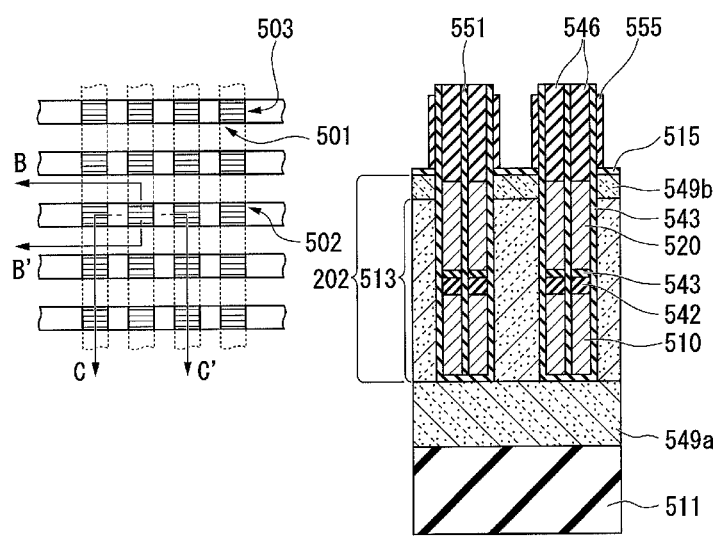
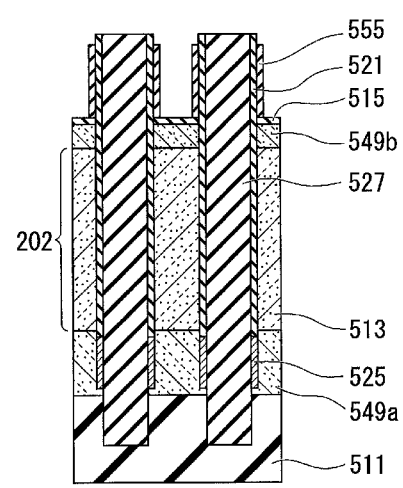

SEMICONDUCTOR DEVICE AND METHOD OF CONTROLLING THE SAME

BACKGROUND OF THE INVENTION

1. Field of the Invention

The present invention relates to a semiconductor device and a method of controlling the same.

Priority is claimed on Japanese Patent Application No. 2009-218819, filed Sep. 24, 2009, the content of which is incorporated herein by reference.

2. Description of the Related Art

Recently, a reduction in chip costs of general-purpose DRAM has been required, and miniaturization of DRAM elements has progressed. A DRAM memory cell includes a transistor and a capacitor. Therefore, the miniaturization of DRAM elements is likely to cause a decrease in capacitance and an increase in leak current of a transistor.

For this reason, next generation memory, such as MRAM (Magnetic RAM), PCM (Phase Change Memory), and FeRAM (Ferroelectric RAM), has been developed to replace DRAM. Additionally, capacitorless memory has attracted attention as a next generation memory device. The capacitorless memory has a simple structure utilizing a floating body effect, which is observed in SOI (Silicon On Insulator) devices.

In related art, memory using the floating body effect (hereinafter, "floating body memory") uses, for a memory operation, a difference in threshold voltage of a transistor, which is caused by a difference in the amount of holes stored in the body (see Japanese Patent Laid-Open Publication No. 2003-68877). However, the difference in threshold voltage between a "0" state and a "1" state is small, and thereby causes unstable operations.

For this reason, a method of using the bipolar current has been proposed in order to increase the difference in threshold voltage between a "0" state and a "1" state (see International Publication No. WO 2007/028583 A1). As a method of stabilizing operations of the floating body memory, nodes of two transistors are shared and connected in series in one memory cell (see International Publication No. WO 2005/122244 A1).

As a technique related to floating body memory, there has been provided a method of providing, on a gate of an HVFET (high-voltage field-effect transistor), a potential distribution such that the absolute value increases as a point comes closer to the drain (see Japanese Patent Laid-Open Publication No. 2005-277377). There has been provided a method of forming a nonvolatile semiconductor memory device including three-dimensionally stacked memory cells (see Japanese Patent Laid-Open Publication No. 2008-72051).

However, a relatively high voltage is required for bipolar operation of a transistor. For this reason, application of the bipolar operation to low-power-consumption DRAM has been difficult. The electrostatic capacitance of a body of the floating body memory, which stores an electric charge, is much smaller than the electrostatic capacitance of a capacitor of DRAM of the related art. For this reason, with the miniaturization of the floating body memory, it has been difficult to increase a data holding time and to enhance the refresh characteristics.

Further, the width of the body region has to be increased in order to increase the data holding time, and therefore the base length during the bipolar operation has to be increased. For this reason, an on-state current decreases, thereby causing an unstable operation.

Moreover, the method of connecting two transistors in series in one memory cell causes an increase in the occupied area of a transistor. For this reason, the occupied area of the memory cell increases, thereby making it difficult to form high-integrated DRAM elements.

SUMMARY

In one embodiment, a semiconductor device may include, but is not limited to: a first insulating film; first and second impurity layers on the first insulating film; a semiconductor layer on the first insulating film; a second insulating film covering the semiconductor layer; a first electrode on the second insulating film over the semiconductor layer; and a second electrode on the second insulating film over the semiconductor layer. The first and second impurity layers have a first conductive type. The first impurity layer is separated from the second impurity layer. The semiconductor layer is positioned between the first and second impurity layers. The semiconductor layer has a second conductive type which is different from the first conductive type. The first electrode is electrically insulated from the second electrode. The second electrode at least partially overlaps the first electrode in plan view.

In another embodiment, there is provided a method of controlling a semiconductor device. The semiconductor device may include, but is not limited to: a first insulating film; first and second impurity layers on the first insulating film; a semiconductor layer on the first insulating film; a second insulating film covering the semiconductor layer; a first electrode on the second insulating film over the semiconductor layer; and a second electrode on the second insulating film over the semiconductor layer. The first and second impurity layers have a first conductive type. The first impurity layer is separated from the second impurity layer. The semiconductor layer is positioned between the first and second impurity layers. The semiconductor layer has a second conductive type which is different from the first conductive type. The first electrode is electrically insulated from the second electrode. The second electrode at least partially overlaps the first electrode in plan view. The method may include, but is not limited to the following processes. In case of writing a data to the semiconductor device or reading a data from the semiconductor device, a first voltage is applied to the first electrode, and a second voltage is applied to the second electrode. The first voltage and the second voltage are different.

BRIEF DESCRIPTION OF THE DRAWINGS

The above features and advantages of the present invention will be more apparent from the following description of certain preferred embodiments taken in conjunction with the accompanying drawings, in which:

FIG. 24A is a plan view illustrating a semiconductor device 200 according to a second embodiment of the present invention;

FIGS. 24B and 24C are cross-sectional views taken along lines B-B' and C-C' shown in FIG. 24A, respectively; and FIGS. 25 to 39 illustrate a process flow indicative of a method of manufacturing the semiconductor device 200 according to the second embodiment, in which FIGS. 25A to 39A are plan views, FIGS. 25B to 39B are cross-sectional views taken along line B-B' shown in FIGS. 25A to 39A, and FIGS. 25C to 39C are cross-sectional views taken along line C-C' shown in FIGS. 25A to 39A.

DETAILED DESCRIPTION OF THE PREFERRED EMBODIMENTS

The present invention will now be described herein with reference to illustrative embodiments. The accompanying drawings explain a semiconductor device and a method of manufacturing the semiconductor device in the embodiments. The size, the thickness, and the like of each illustrated portion might be different from those of each portion of an actual semiconductor device.

Those skilled in the art will recognize that many alternative embodiments can be accomplished using the teachings of the present invention and that the present invention is not limited to the embodiments illustrated herein for explanatory purposes.

First Embodiment

Hereinafter, a semiconductor device 1 according to a first embodiment of the present invention is explained with reference to FIGS. 1 and 2. The first embodiment explains a case where the present invention is applied to an n-type MOSFET (Metal-Oxide-Semiconductor Field-Effect Transistor) of a DRAM memory cell.

Figure 1:
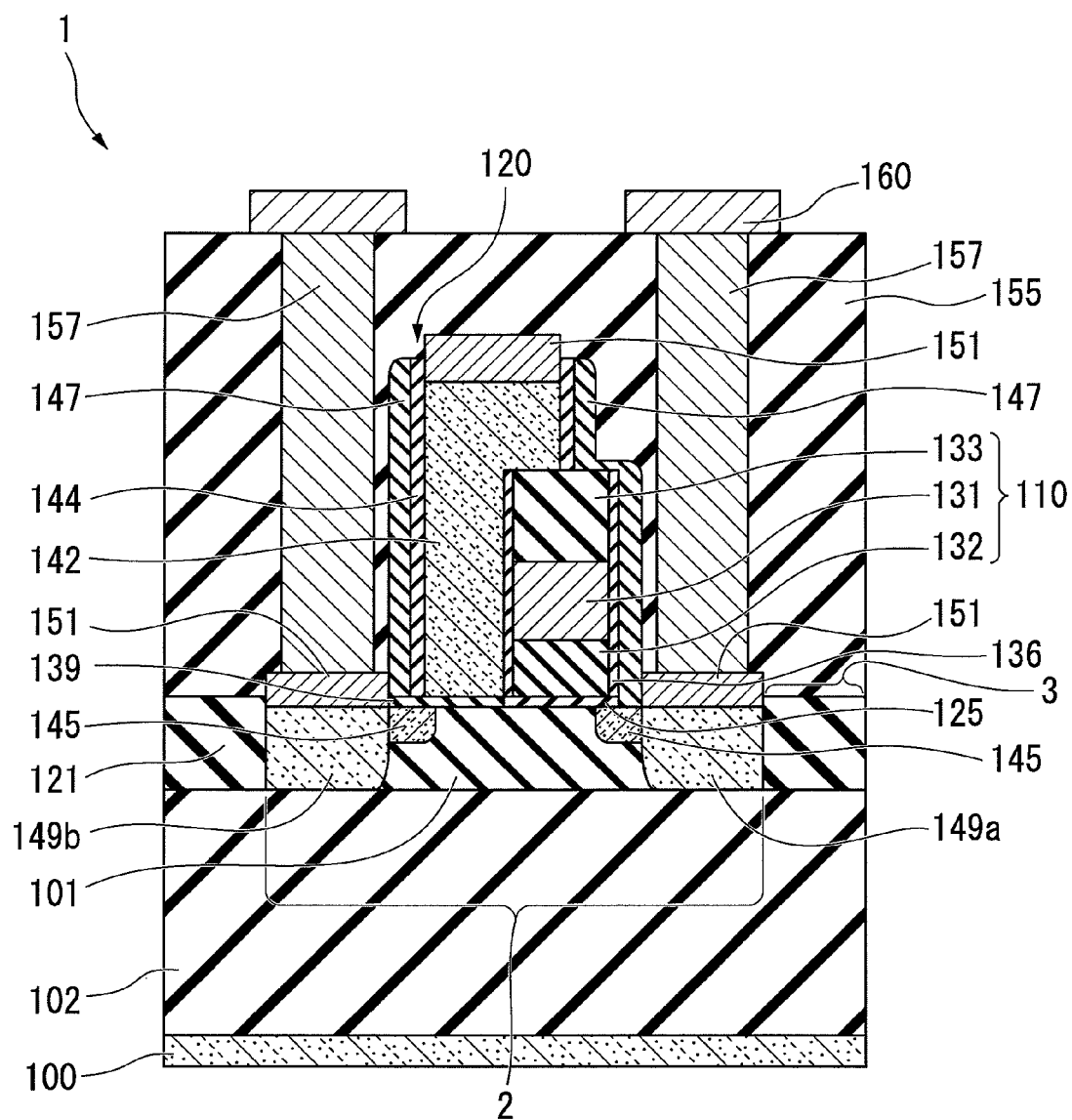
FIG. 1 is a cross-sectional view illustrating a semiconductor device 1 according to a first embodiment of the present invention.

FIG. 1 is a cross-sectional view illustrating the semiconductor device 1. FIG. 2 is a plan view illustrating the semiconductor device 1. FIG. 1 is a cross-sectional view taken along line A-A' shown in FIG. 2.

The semiconductor device 1 includes, but is not limited to: a support board 100; an insulating film 102; a semiconductor layer (active region) 2; a first gate electrode 110; a second gate electrode 120; a contact plug 157; and a metal wiring layer 160.

The support board 100 includes a glass board, a semiconductor board, and the like. The insulating film 102 includes a silicon oxide ($SiO_2$) film and the like. The insulating film 102 covers the support board 100. The materials forming the support board 100 and the insulating film 102 are not limited to the above materials.

The semiconductor layer (active region) 2 includes: a body region 101; a first diffusion region 149a; a second diffusion region 149b; and an LDD diffusion layer 145. The semiconductor layer (active region) 2 covers the insulating film 102. Multiple semiconductor layers (active regions) 2 are defined by an element isolation region 3. The semiconductor layers 2 are arranged at a predetermined pitch. The element isolation region 3 includes an embedded oxide film 121, which forms STI (Shallow Trench Isolation).

The semiconductor layer (active region) 2 is made of p-type silicon. The first diffusion region 149a and the second diffusion region 149b are positioned adjacent to opposing sides of the semiconductor layer (active region) 2. Each of the first and second diffusion regions 149a and 149b is made of silicon, into which an n-type impurity, such as arsenic (As), is diffused at a dose of $4\times10^{15}/cm^2$. The first diffusion region 149a and the second diffusion region 149b function as a drain region and a source region, respectively.

The LDD diffusion layer 145 is formed adjacent to each of opposing inner side surfaces of the first and second diffusion regions 149a and 149b. The LDD diffusion layer 145 is made of silicon, into which an impurity, such as phosphorus (P), is diffused at a dose of approximately $1\times10^{13}/cm^2$. A floating body region 101 is formed in the semiconductor layer (active region) 2, between the first and second diffusion regions 149a and 149b.

A gate insulating film (a first gate insulating film 125 and a second gate insulating film 139) is formed so as to cover the body region 101. A silicon nitride film 147 is formed over the LDD diffusion region 145 on one side. A silicide layer 151 is formed over each of the first and second diffusion regions 149a and 149b. The silicide layer 151 is made of a high-melting point metal, such as titanium (Ti).

The first gate electrode 110 is formed over the body region 101 through the gate insulating film (first gate insulating film) 125. The first gate electrode 110 has a pillar structure including: a first poly-silicon film 132; a W/WN film 131 over the first poly-silicon film 132; and a first silicon nitride film 133 over the W/WN film 131. An outer side surface of the first gate electrode 110 is covered by a second silicon nitride film 136 having a thickness of approximately 8 nm. Accordingly, a bottom surface, the outer side surface, and a top surface of the first gate electrode 110 are covered by the first gate insulating film 125, the second silicon nitride film 136, and the first silicon nitride film 133, respectively. Therefore, the first gate electrode 110 is electrically insulated from peripheral elements.

The second gate electrode 120 includes a second poly-silicon film 142 having a thickness of approximately 100 nm. Phosphorus (P) is doped into the second poly-silicon film 142 at a concentration of approximately $1\times10^{20}/cm^3$. The second gate electrode 120 is formed over the body region 101 through the gate insulating film (second gate insulating film) 139. The second gate electrode 120 partially overlaps the first gate electrode 110 in plan view as shown in FIG. 2. The second gate electrode 120 is adjacent to the first gate electrode 110, but is insulated from the first gate electrode 110 by the nitride films (the first silicon nitride film 133 and the second silicon nitride film 110).

An upper surface and an outer side surface of the second gate electrode 120 are covered by a silicide layer 151 and an oxide film 144, respectively. The silicide layer 151 is made of a high melting point metal, such as titanium (Ti). The oxide film 144 has a thickness of approximately 2 nm to 3 nm. Accordingly, the bottom surface, the side surface, and the upper surface of the second gate electrode 120 are covered by the second gate insulating film 139, the oxide film 144, and an inter-layer insulating film 155, respectively. Thus, the second gate electrode 120 is electrically insulated from peripheral elements.

Figure 2:
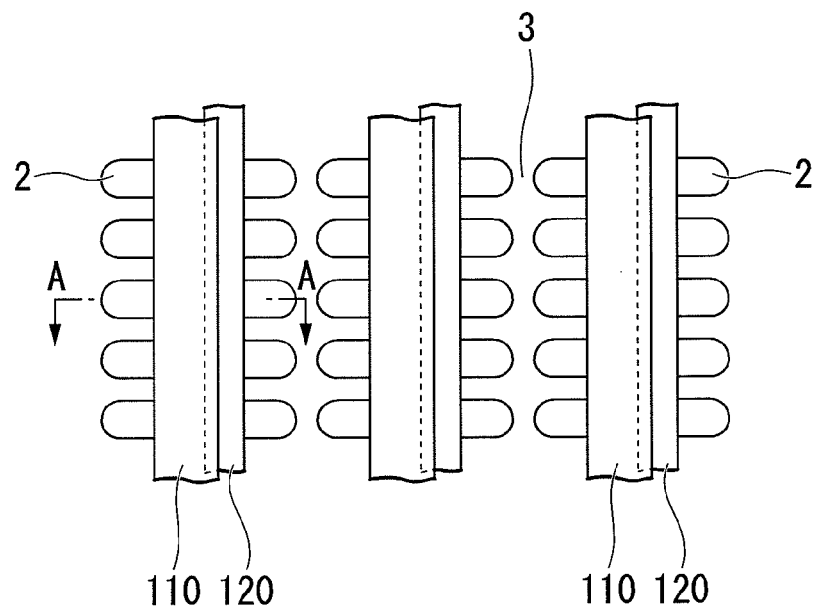
FIG. 2 is a plan view illustrating the semiconductor device 1.

FIG. 2 is a plan view illustrating the first and second gate electrodes 110 and 120. The first gate electrode 110 is adjacent to the second gate electrode 120. The first and second gate electrodes 110 and 120 cross the semiconductor layer (active region) 2 in plan view. In this case, the angle between the semiconductor layer (active region) 2 and the first and second gate electrodes 110 and 120 may not be 90 degrees.

An outer side surface of the oxide film 144, an upper surface of the first silicon nitride film 133, and an outer side surface of the second silicon nitride film 136 are covered by the silicon nitride film 147. The silicon nitride film 147 has a thickness of approximately 15 nm. Accordingly, the silicon nitride film 147 covers the entire side surfaces of the first and second gate electrodes 110 and 120. The inter-layer insulating film 155 covers the first and second electrodes 110 and 120, and the element isolation region 3.

The contact plug 157 is made of, for example, tungsten (W). The contact plug 157 penetrates the inter-layer insulating film 155 and connects to the silicide layer 151. Further, the contact plugs 157 (not shown) are connected to the first and second gate electrodes 110 and 120.

The metal wiring layer 160 is made of aluminum (Al), copper (Cu), and the like. The metal wiring layer 160 is connected to an upper surface of the contact plug 157. Another wiring layer or a surface protection film may be formed over the metal wiring layer 160.

Figure 19:
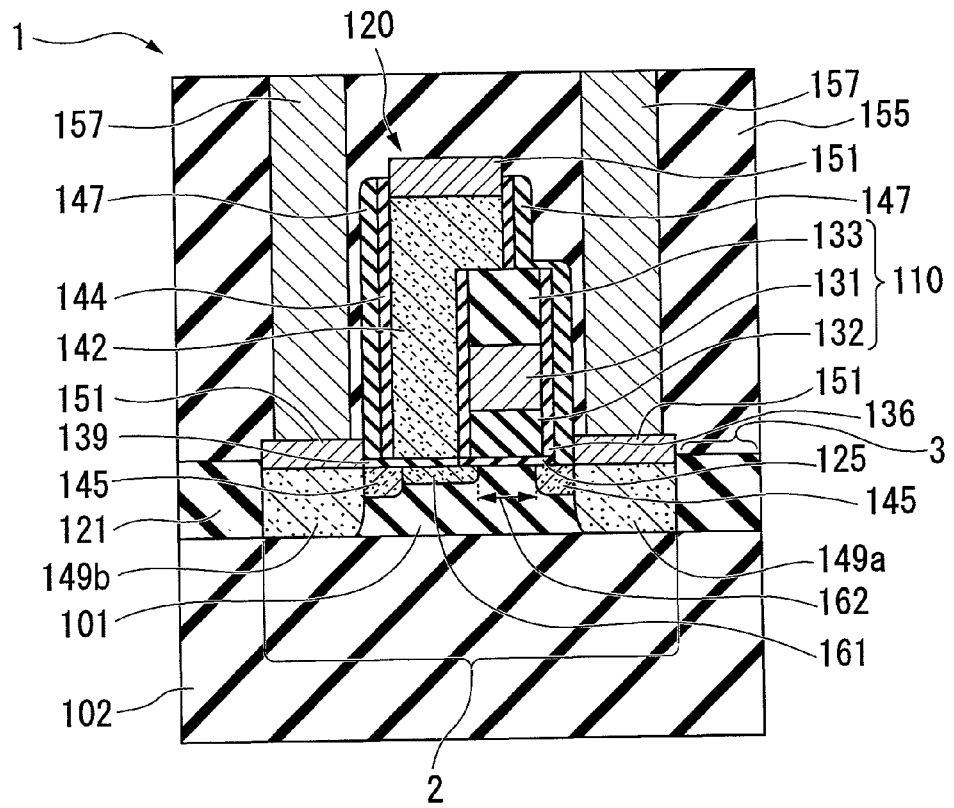
FIG. 19 illustrates a state where a voltage is applied to the semiconductor device 1.

As shown in FIG. 19, when a voltage is applied to the first gate electrode 110 upon reading of data, an inversion layer 161 having the same conductive type as that of the LDD diffusion layer 145 can be formed in the body region 101, below the first gate electrode 110. FIG. 19 illustrates a state where voltages of +2 V, +2 V, -1 V, 0 V are applied to the drain, the first gate electrode 110, the second gate electrode 120, and the second diffusion region (source region) 149b, respectively, which is the case where the bipolar current flows.

In this case, the potential of the second diffusion region 149b on the side of the second gate electrode 120 varies. Accordingly, the effective base length 162 is shorter than the actual distance between the first diffusion region (drain region) 149a and the second diffusion region (source region) 149b. For this reason, the bipolar current can be made to flow easily by applying a small drain voltage, thereby stabilizing memory operations.

In one body region, the first gate electrode 110 partially overlaps the second gate electrode 120 in plan view. Further, the first gate electrode 110 is electrically insulated from the second gate electrode 120. Therefore, the occupied area of the memory cell can be reduced. Further, there is no need to provide the first and second diffusion regions 149a and 149b between the first and second gate electrodes 110 and 120, thereby enabling higher integration of DRAM elements.

Hereinafter, a method of manufacturing the semiconductor device 1 according to the first embodiment is explained with reference to FIGS. 3 to 18.

The method of the first embodiment includes, but is not limited to: a process of preparing an SOI (Silicon On Insulator) substrate 104; a process of forming the active region 2; a process of forming the first gate electrode 110; a process of forming the second silicon nitride film 136; a process of forming the second gate insulating film 139; a process of forming the second gate electrode 120; a process of forming the oxide film 144; a process of forming the LDD diffusion layer 145; a process of forming the silicon nitride film 147; a process of forming the first and second diffusion regions 149a and 149b; a process of forming the silicide layer 151; a process of forming the inter-layer insulating film 155; and a process of forming the contact plug 157. Hereinafter, each of the processes is explained in detail. FIGS. 1, 3 to 18 are cross-sectional views taken along line A-A' shown in FIG. 2.

Figure 3:
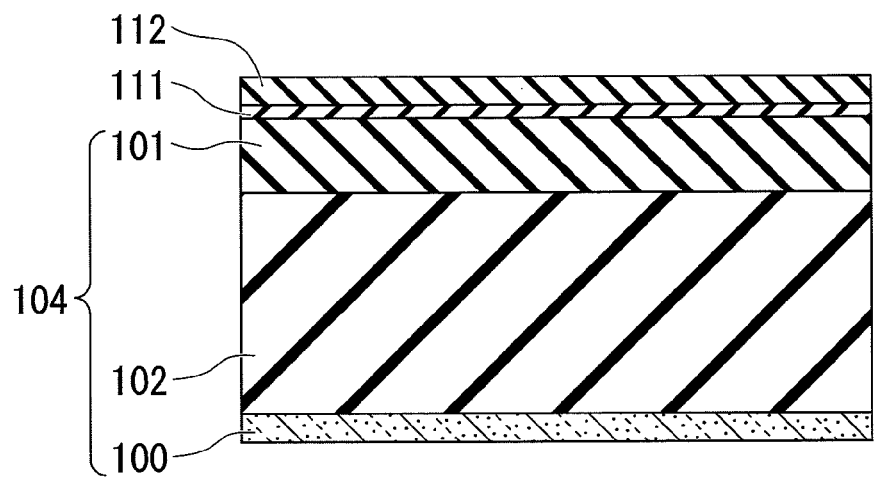
FIGS. 3 to 18 are cross-sectional views indicative of a process flow illustrating a method of manufacturing the semiconductor device 1 according to the first embodiment.

In the process of preparing the SOI substrate 104, the support board 100 is formed. The support board 100 includes, but is not limited to a glass board, a semiconductor board, and the like. Then, the insulating film 102 is formed on the support substrate 100. The insulating film 102 includes, but is not limited to the silicon oxide ($SiO_2$) film, and the like. Then, the body region 101 is formed on the insulating film 102. Thus, the SOI substrate 104 is formed as shown in FIG. 3. An illustration of the support board 100 is omitted in the following drawings.

In the process of forming the semiconductor layer (active region) 2, the body region 101 is subjected to a thermal oxidation process so as to form a silicon oxide ($SiO_2$) film 111 covering the body region 101. The silicon oxide film 111 has a thickness of approximately 10 nm. Then, a silicon nitride ($Si_3N_4$) film 112 is formed by LP-CVD (Low-Pressure Chemical Vapor Deposition) so as to cover the silicon oxide film 112. The silicon nitride film 112 has a thickness of approximately 150 nm.

Figure 4:
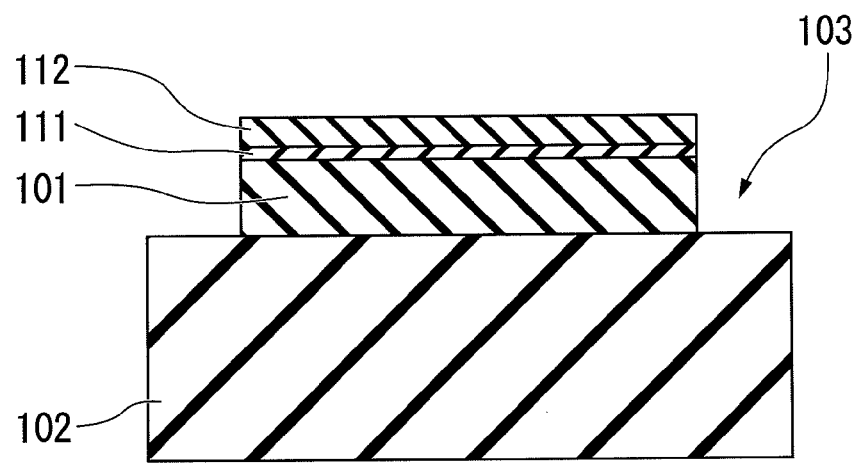

Then, a stack of the silicon nitride film 112, the silicon oxide film 111, and the body region 101 is patterned using known photolithography and dry etching techniques, as shown in FIG. 4. In this case, an etching condition is adjusted so that a trench (groove pattern) 103 is formed so as to partially expose an upper surface of the insulating film 102. Thus, the trench 103 is used for forming the element isolation region 3 having an STI structure in a later process.

Then, a silicon oxide film 121 is formed using known HDP-CVD (High Density Plasma-CVD) so as to fill the trench 103 and to cover the silicon nitride film 112. Then, the silicon oxide film 121 is polished by CMP (Chemical Mechanical Polishing) using the silicon nitride film 112 as a stopper film. Thus, the trench 103 is filled with the silicon oxide film 121.

Figure 5:
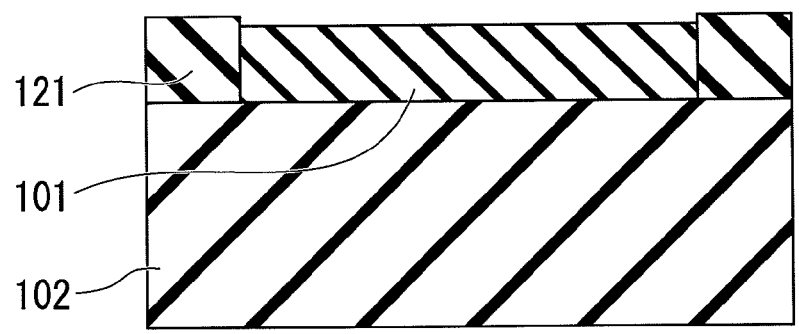

Then, the silicon nitride film 112 is removed by wet etching with phosphoric acid ($H_3PO_4$). Then, the silicon oxide film 111 is removed using diluted hydrofluoric acid (HF). Thus, the element isolation region 3, which is made of the silicon oxide film 121, is formed so as to surround the body region 101, as shown in FIG. 5. Accordingly, the active region 2 is defined by the element isolation region 3, as shown in FIG. 2.

In this case, side and bottom surfaces of the active region 2 are covered by the silicon oxide film 121 and the insulating film 102, respectively. Therefore, the active region 2 is electrically insulated from peripheral elements. For this reason, the active region 2 enters an electrically floating state when the semiconductor device 1 operates.

Figure 6:
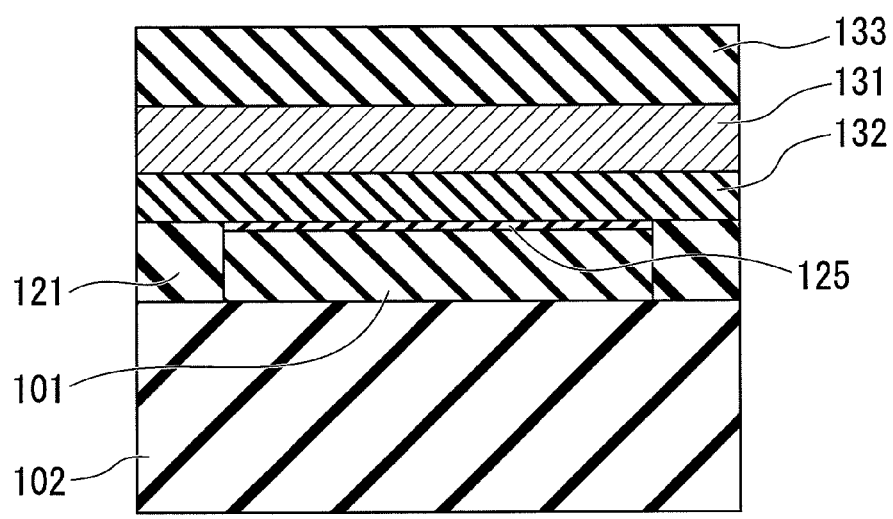

In the process of forming the first gate electrode 110, the gate insulating film (first gate insulating film) 125 is formed by thermal oxidation, such as ISSG (In-Situ Stream Generation) oxidation, so as to cover the body region 101. The gate insulating film has a thickness of approximately 6 nm. Then, the first poly-silicon film 132, into which phosphorus (P) is doped at a concentration of approximately $1 \times 10^{20}/cm^3$, is formed so as to cover the first gate insulating film 125. The first gate insulating film 125 has a thickness of approximately 80 nm. Then, the W/WN film 131 is formed over the first poly-silicon film 132. The W/WN film 131 includes a tungsten nitride (WN) film having a thickness of approximately 5 nm and a tungsten (W) film having a thickness of approximately 70 nm. Then, the first silicon nitride film 133, which has a thickness of approximately 140 nm, is formed over the W/WN film 131. Thus, the first poly-silicon film 132, the W/WN film 131, and the first silicon nitride film 133 are formed as shown in FIG. 6.

Figure 7:
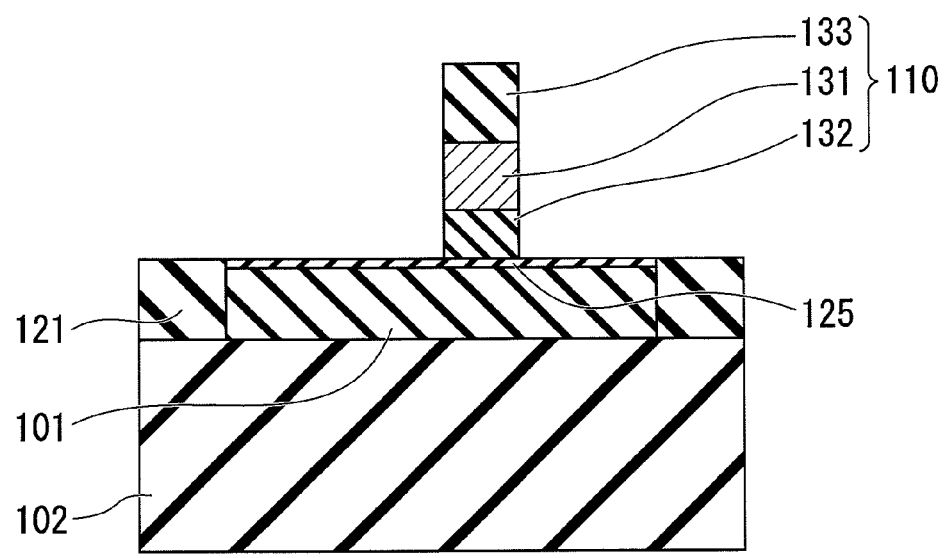

Then, the first silicon nitride film 133 is patterned using known lithography and dry-etching techniques. Then, a stack of the first poly-silicon film 132 and the W/WN film 131 is dry-etched using the patterned first silicon nitride film 133 as a mask. Thus, the first gate electrode 110 is formed over the semiconductor layer (active region) 2 through the gate insulating film (first gate insulating film) 125, as shown in FIG. 7.

Figure 8:
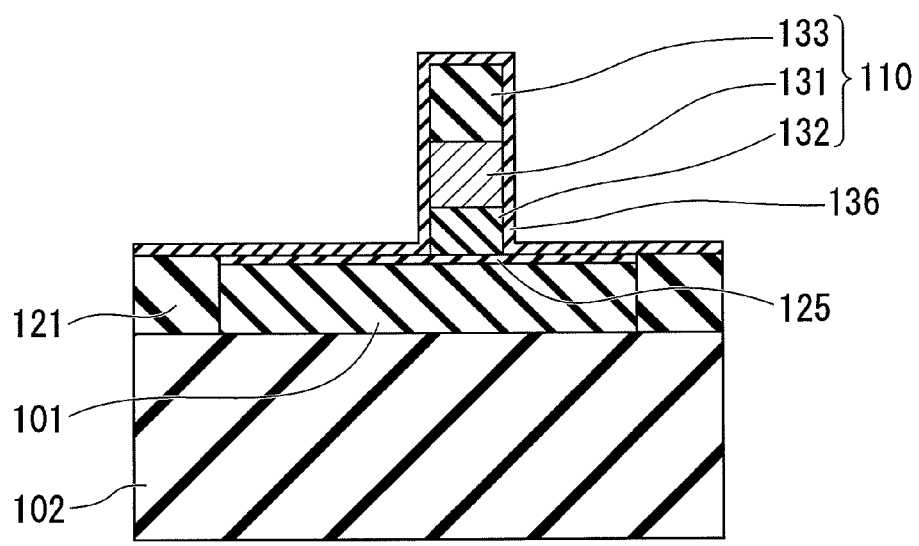

Then, the second silicon nitride film 136, which has a thickness of approximately 8 nm, is formed by LP-CVD so as to cover the first gate electrode 110, the oxide film 121, and the first gate insulating film 125, as shown in FIG. 8.

Figure 9:
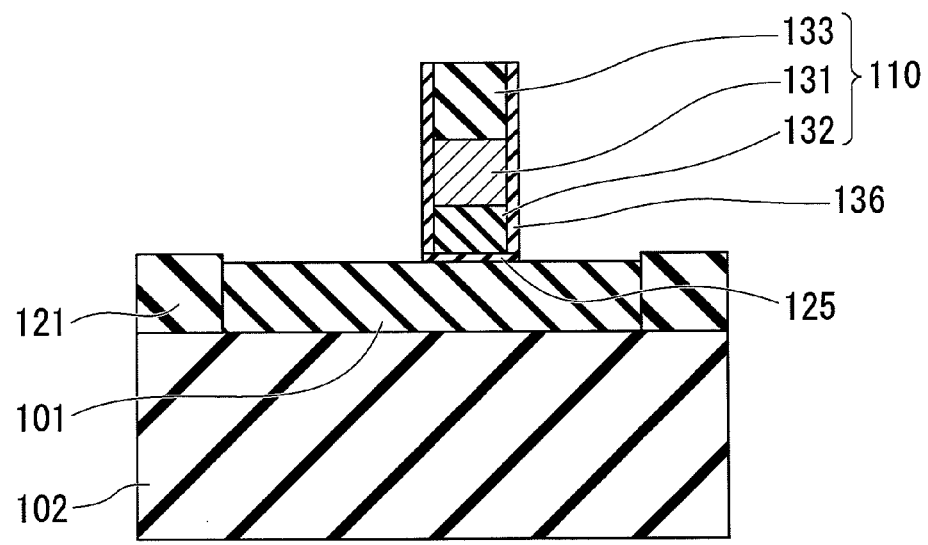

Then, portions of the second silicon nitride film 136, which cover the upper surfaces of the first gate electrode 110, the oxide film 121, and the first gate insulating film 125, are removed by anisotropic dry etching using the first gate electrode 110 as a mask. Thus, a remaining portion of the second nitride film 136 covers only the side surface of the first gate electrode 110, as shown in FIG. 9.

Figure 10:
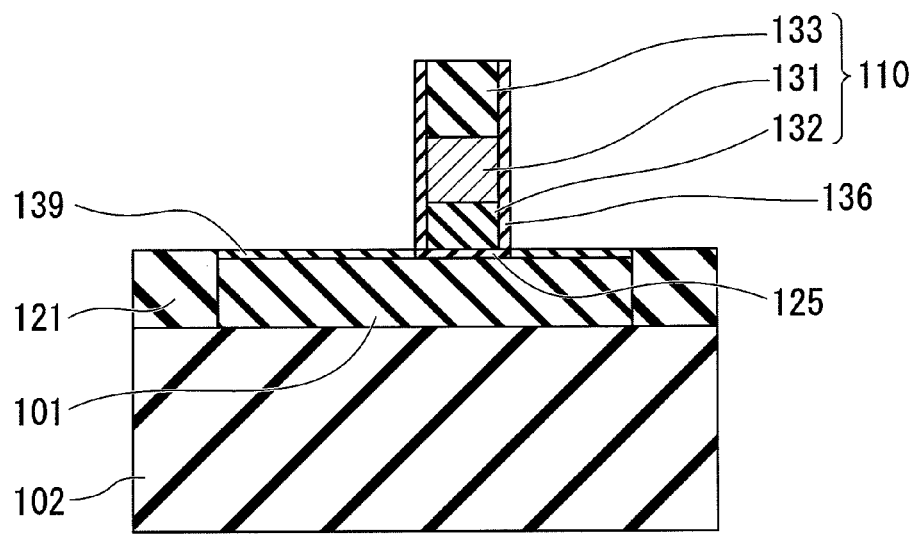

Then, an exposed portion of the first gate insulating film 125 on the body region 101 is removed by wet etching. Then, the second gate insulating film 139, which is made of a silicon oxide film, is formed by thermal oxidation so as to cover the body region 101, as shown in FIG. 10.

Figure 11:
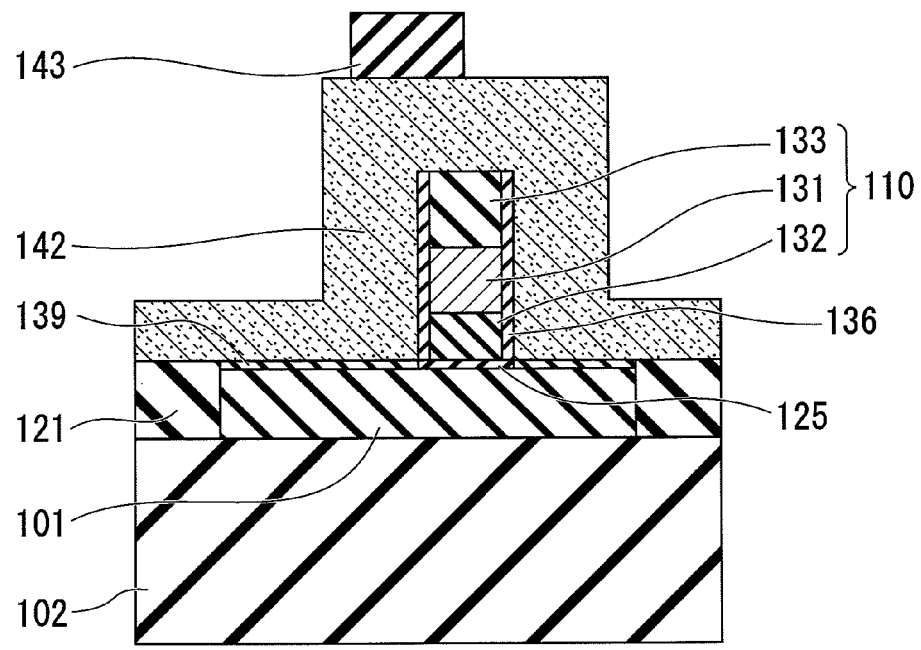

In the process of forming the second gate electrode 120, the second poly-silicon film 142, which has a thickness of approximately 100 nm, is formed so as to cover the gate insulating film (second gate insulating film) 139 and the first gate electrode 110. The second poly-silicon film 142 is formed by doping phosphorus into a poly-silicon film at a concentration of approximately $1 \times 10^{20}/cm^3$. Then, a mask pattern 143, which is made of a photoresist film, is formed on the second poly-silicon film 142 using a known photolithography technique, as shown in FIG. 11. In this case, the mask pattern 143 is formed so as to partially overlap the first gate electrode 110 in plan view.

Figure 12:
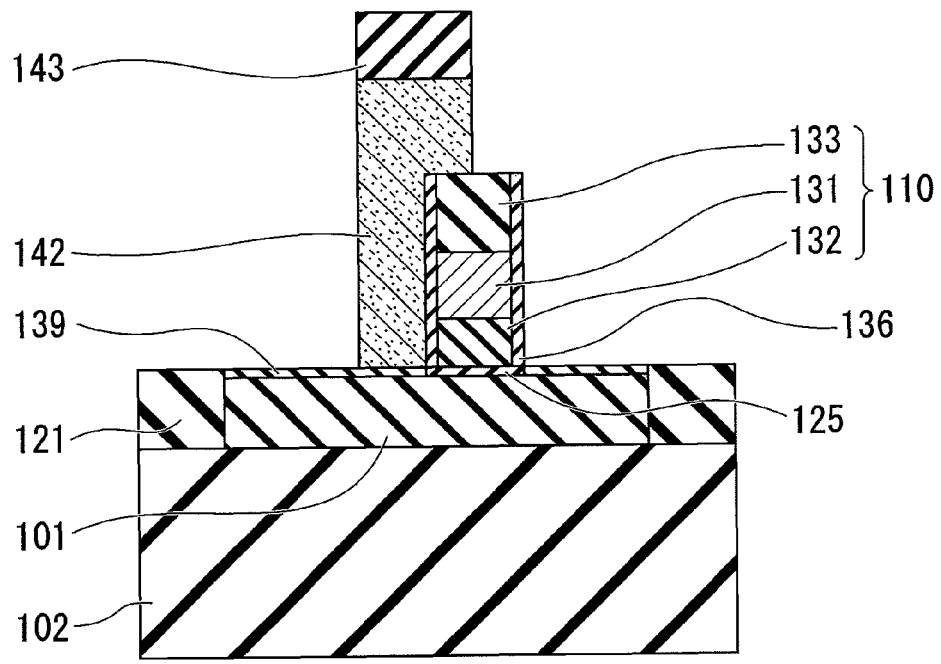

Then, the second poly-silicon film 142 is etched with a gas containing, for example, $Cl_2$, HBr, and $O_2$, using the mask pattern 143. The etching is carried out with a high etching selectivity of the second poly-silicon film 142. Thus, the second gate electrode 120, which partially covers the first gate electrode 110 through the second silicon nitride film 136 and the first silicon nitride film 133, is formed as shown in FIG. 12.

Figure 13:
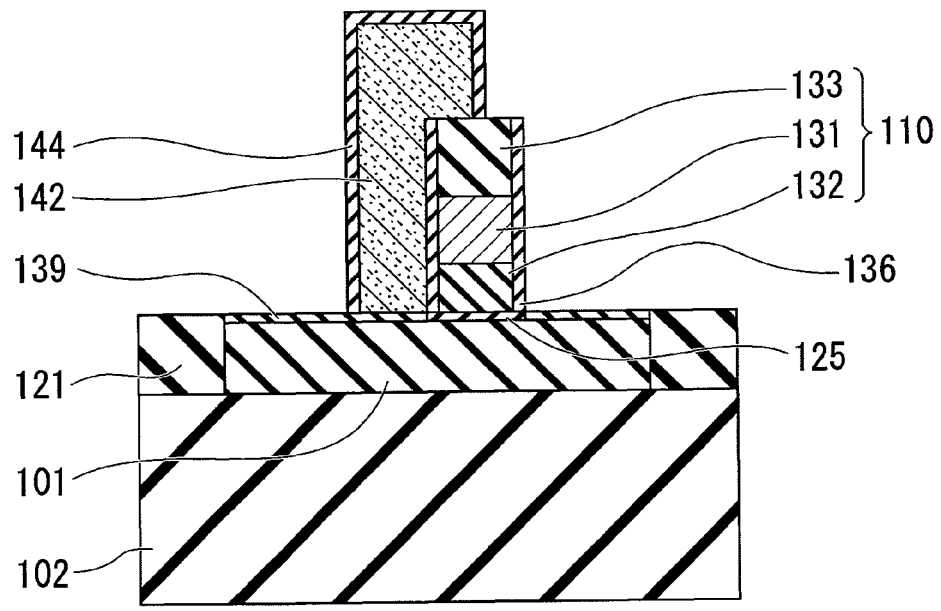

Then, the photoresist film 143 is removed. Then, the oxide film 144, which is made of a silicon oxide film, is formed by thermal oxidation so as to cover the second gate electrode 120, as shown in FIG. 13. The oxide film 144 has a thickness of approximately 2 nm to 3 nm.

Figure 14:
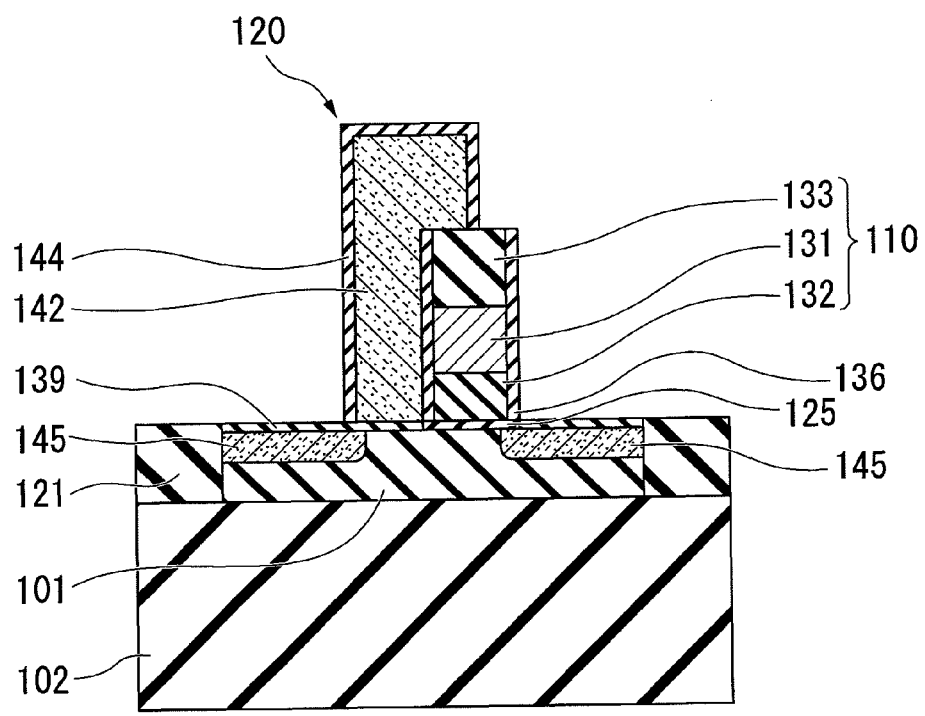

In the process of forming the LDD diffusion layer 145, an n-type impurity, such as phosphorus (P), is ion-implanted into the body region 101 at an energy of 10 keV to 20 keV, at a dose of approximately $1 \times 10^{13}/cm^2$. Then, a thermal treatment is carried out for approximately 10 seconds, at a temperature of 950° C. Thus, the LDD diffusion layer 145 is formed in the body region 101, as shown in FIG. 14. For the thermal treatment, lamp heating and the like can be carried out by an RTA (Rapid Thermal Annealing) apparatus and the like.

Figure 15:
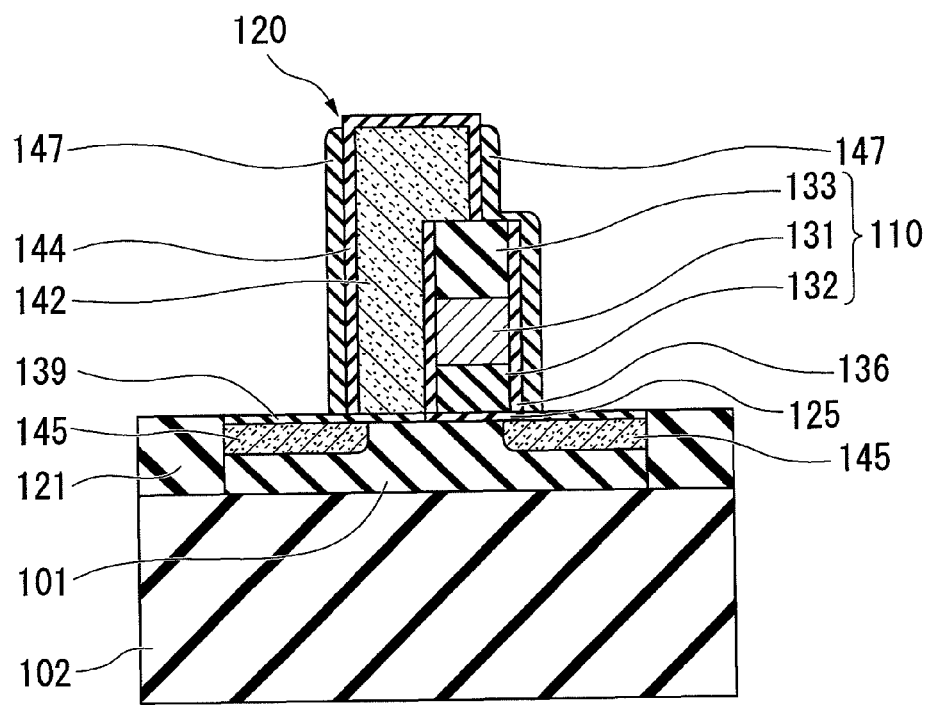

In the process of forming the silicon nitride film 147, a silicon nitride film, which has a thickness of 15 nm, is formed by LP-CVD so as to cover the second gate insulating film 139, the oxide film 121, and the first and second gate electrodes 110 and 120. Then, a portion of the silicon nitride film which covers the second gate insulating film 139 and the oxide film 121, and a portion of the silicon nitride film which covers upper surfaces of the first and second gate electrodes 110 and 120 are removed by anisotropic dry etching. Thus, the nitride film 147, which covers side surfaces of the first and second gate electrodes 110 and 120, is formed as shown in FIG. 15.

Figure 16:
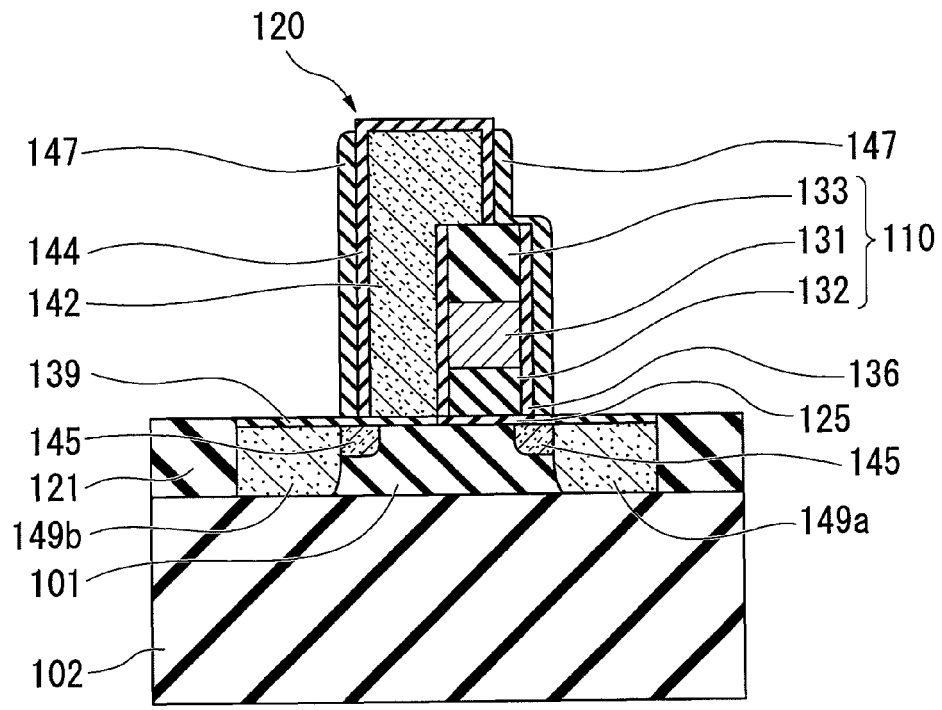

In the process of forming the first and second diffusion regions 149a and 149b, an n-type impurity, such as arsenic, is ion-implanted into the semiconductor layer (active region) 2 at an energy of 20 keV to 40 keV, at a dose of approximately $4 \times 10^{15}/cm^2$. Then, a thermal treatment is carried out for approximately 10 seconds, at a temperature of 950° C. Thus, the first and second diffusion regions 149a and 149b are formed in the semiconductor layer (active region) 2 such that the first and second diffusion regions 149a and 149b are adjacent to the first and second gate electrodes 110 and 120, respectively, as shown in FIG. 16. Consequently, the body region 101 remains between the first and second diffusion regions 149a and 149b.

Figure 17:
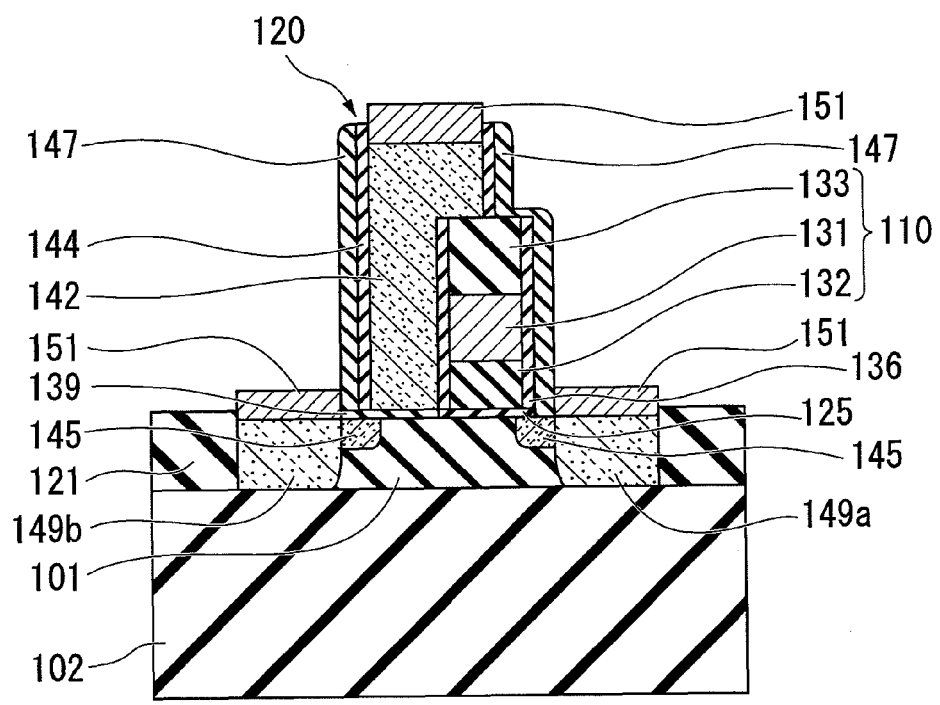

In the process of forming the silicide layer 151, a portion of the silicon oxide film 139 which covers the source—and/or—drain diffusion layer 149, and a portion of the oxide film 144 which covers the upper surface of the second gate electrode 120 are removed by wet etching and the like. Then, a silicide layer 151 is formed by a self-aligned siliciding technique so as to cover the upper surfaces of the second gate electrode 120 and the source—and/or—drain diffusion layer 149. The silicide layer 151 is made of a high melting point metal, such as titanium. Thus, the silicide layer 151 is formed over the second gate electrode 120 and the source—and/or—drain diffusion layer 149, as shown in FIG. 17.

Figure 18:
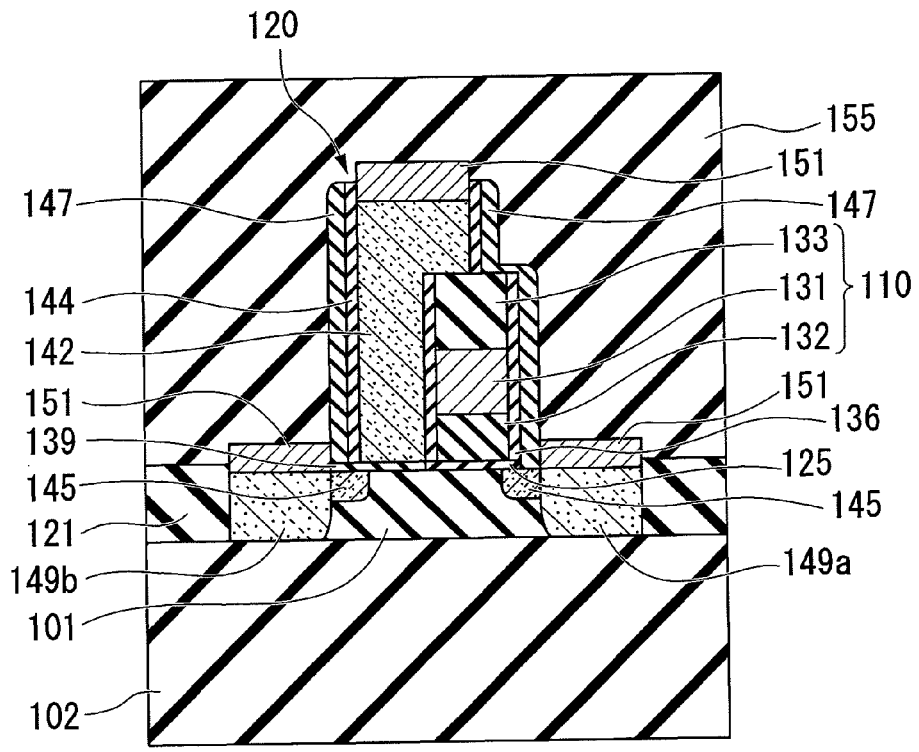

In the process of forming the inter-layer insulating film 155, a BPSG film is formed by CVD so as to cover the entire surface. Then, a reflow process is carried out in a nitrogen atmosphere, at a temperature of approximately 750° C. Thus, the inter-layer insulating film 155 is formed as shown in FIG. 18. In this case, a process of planarizing an upper surface of the inter-layer insulating film 155 using CMP may be added.

In the process of forming the contact plug 157, a contact hole 152 is formed by photolithography and dry etching techniques so as to penetrate the inter-layer insulating film 155 and to expose the upper surface of the silicide layer 151. Then, a tungsten (W) film and the like are formed by CVD so as to fill the contact hole 152. Then, the CMP is carried out so that the upper surface of the inter-layer insulating film 155 is exposed. Thus, the contact plug 157 is formed as shown in FIG. 19. In the same process, the contact plugs 157 (not shown), which are connected to the first and second gate electrodes 110 and 120, are formed.

Then, the metal wiring layer 160, made of aluminum (Al), copper (Cu), and the like, is formed so as to be connected to each of the contact plugs 157. Thus, the semiconductor device 1 is formed. Another wiring layer, a surface protection film, and the like may be formed over the metal wiring layer 160.

Hereinafter, a comparison between operation characteristics of the semiconductor device 1 of the first embodiment and a semiconductor device of the related art having only one gate electrode is explained with reference to FIGS. 19 to 23. In this case, the same voltage as applied to the first gate electrode 110 of the first embodiment is applied to the gate electrode of the semiconductor device of the related art.

An operation of the semiconductor device 1 of the first embodiment is explained hereinafter. As shown in FIG. 19, a voltage is applied to the first gate electrode 110 upon reading of data so that the inversion layer 161, which has the same conductivity type as that of the LDD diffusion layer 145, can be formed below the first gate electrode 110 in the body region 101. FIG. 19 illustrates a case where voltages of +2 V, +2 V, −1 V, and 0 V are applied to the first diffusion region 149a, the first gate electrode 110, the second gate electrode 120, and the second diffusion region (source region) 149b, respectively, which is the state where the bipolar current flows.

In this case, a body potential of the second diffusion region 149b on the side of the second gate electrode 120 varies. Accordingly, the effective base length 162 is shorter than the actual distance between the first diffusion region (drain region) 149a and the second diffusion region (source region) 149b. For this reason, the bipolar current can be made to flow easily by applying a small drain voltage, thereby stabilizing memory operations.

Figure 20:
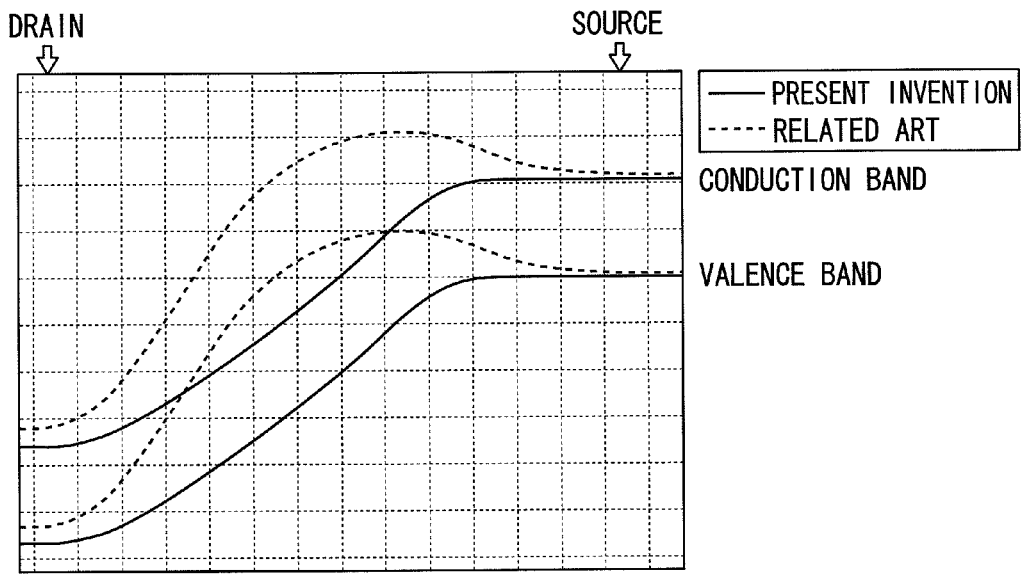
FIG. 20 illustrates an energy band when a voltage is applied to the semiconductor device 1.

FIG. 20 illustrates energy bands when a voltage is applied as shown in FIG. 19. A horizontal axis denotes a point between the first diffusion region (drain region) 149a and the second diffusion region (source region) 149b. The left end and the right end correspond to the drain region and the source region, respectively. A vertical axis denotes power energy (electrostatic potential). In the first embodiment, the first gate electrode 110 is provided between the first diffusion region (drain region) 149a and the second diffusion region (source region) 149b, thereby enabling a further reduction in potential barrier compared to the semiconductor device of the related art.

Figure 21:
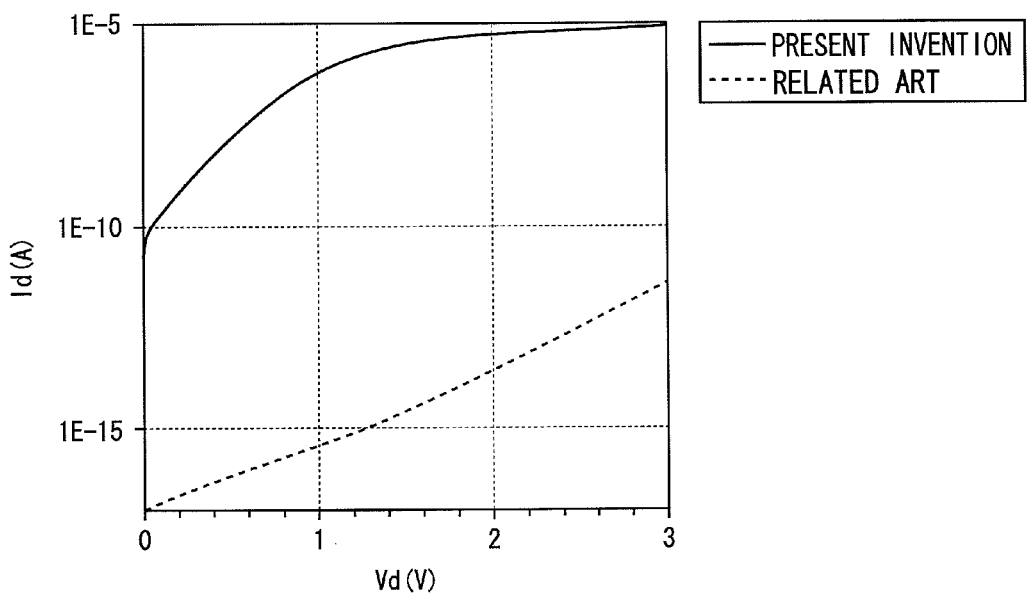
FIG. 21 is a graph illustrating the relationship between a drain current and a drain voltage when a voltage is applied to the semiconductor device 1.

FIG. 21 illustrates the relationship between a drain current Id (vertical axis) and a drain voltage Vd (horizontal axis) when voltages of −1 V, +2 V, and 0 V are applied to the first gate electrode 110, the second gate electrode 120, and the source, respectively. As can be understood from FIG. 21, even if a drain voltage applied to the semiconductor device 1 of the first embodiment is smaller than that applied to the semiconductor device of the related art, the semiconductor device 1 can achieve a larger drain current than the semiconductor device of the related art. In other words, in the first embodiment, a larger bipolar current than in the case of the related art can be achieved by applying a smaller drain voltage than in the case of the related art, thereby stabilizing memory operations of the semiconductor device 1.

The semiconductor device 1 of the first embodiment can perform memory operations (writing and reading of data) by using the bipolar current generated in the body region in the electrically floating state. Different voltages can be applied to the first diffusion region (drain region) 149a, the second diffusion region (source region) 149b, the first gate electrode 110, and the second gate electrode 120.

The first gate electrode 110 and the second gate electrode 120 are electrically insulated from each other, and therefore can use the entire body region 2 for storing an electric charge (hole).

Hereinafter, operations of wiring of "1," writing of "0," reading of data, and storing of data are explained in detail.

When the semiconductor device 1 performs writing of "1," a reference voltage, such as 0 V, is set to the second diffusion region (source region) 149b. A first voltage, such as 2 V, which is higher than the reference voltage, is applied to the first diffusion region (drain region) 149a. A second voltage, such as 2 V, which is the same as the first voltage, is applied to the first gate electrode 110. A third voltage, such as 1 V, which is higher than the reference voltage and lower than the second voltage, is applied to the second gate electrode 120.

When the semiconductor device 1 performs writing of "0," a reference voltage, such as 1 V, is set to the second diffusion region (source region) 149b. A first voltage, such as 2 V, which is higher than the reference voltage, is applied to the first diffusion region (drain region) 149a. A second voltage, such as −1.2 V, which is lower than the reference voltage, is applied to the first gate electrode 110. A third voltage, such as 1 V, which is the same as the reference voltage, is applied to the second gate electrode 120.

When the semiconductor device 1 performs reading of data, a reference voltage, such as 0 V, is set to the second diffusion region (source region) 149b. A first voltage, such as 2 V, which is higher than the reference voltage, is applied to the first diffusion region (drain region) 149a. A second voltage, such as 2 V, which is the same as the first voltage, is applied to the first gate electrode 110. A third voltage, such as −0.8 V, which is lower than the reference voltage, is applied to the second gate electrode 120.

When the semiconductor device 1 performs storing of data, a reference voltage, such as 0 V, is set to the second diffusion region (source region) 149b. A first voltage, such as 0 V, which is the same as the reference voltage, is applied to the first diffusion region (drain region) 149a. A second voltage, such as −1.2 V, which is lower than the reference voltage, is applied to the first gate electrode 110. A third voltage, such as −1.2 V, which is the same as the second voltage, is applied to the second gate electrode 120. The entire body region is used for storing electric charge (hole) upon storing of data, thereby enhancing the refresh characteristics.

Figure 22:
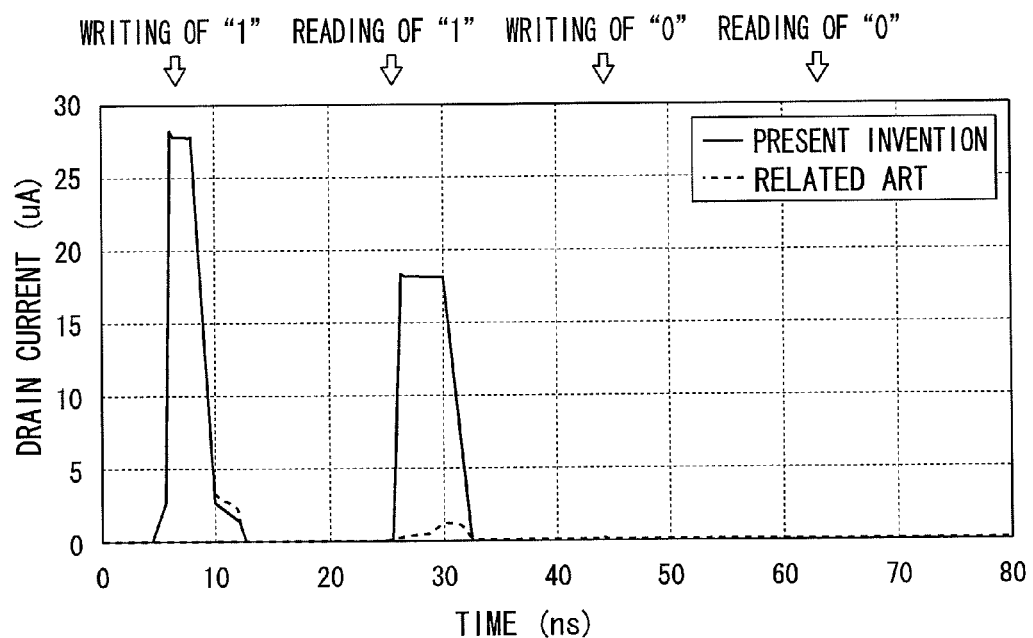
FIG. 22 is a graph illustrating a drain current when the semiconductor device 1 performs a series of memory operations.

FIG. 22 illustrates the amount of a drain current when a series of memory operations (writing and reading) is performed under the above voltage conditions. A horizontal axis denotes time. Each time a predetermined time passes, voltages shown in Table 1 below are applied to the respective electrodes, and thus each operation shown in FIG. 22 is performed.

TABLE 1

|  | FIRST DIFFUSION REGION 149a | FIRST GATE ELECTRODE 110 | SECOND GATE ELECTRODE 120 | SECOND DIFFUSION REGION 149b |
|---|---|---|---|---|
| WRITING OF "1" | 2 | 2 | 1 | 0 |
| WRITING OF "0" | 2 | −1.2 | 1 | 1 |
| READING | 2 | 2 | −0.8 | 0 |
| STORING | 0 | −1.2 | −1.2 | 0 |

When 2 V is set to the drain voltage, a drain current hardly flows in the semiconductor device of the related art. Further, the semiconductor device of the related art cannot stably perform reading of data upon reading of "1." On the other hand, it can be understood from FIG. 22 that a large drain current flows. Accordingly, the semiconductor device 1 of the first embodiment can easily read data of "1" even if the applied drain voltage is low.

The semiconductor device 1 of the first embodiment can store the written data by applying the voltages shown by the entry of "STORING" to the respective electrodes (first and second gate electrodes 110 and 120). In other words, the semiconductor device 1 can store an electric charge (hole) in the body region, and thereby can store the written data. However, the electric charge (hole) in the body region gradually decreases even in the data storing state. Therefore, in order to store data, a refresh operation has to be performed and the data has to be rewritten after a predetermined time passes.

Figure 23:
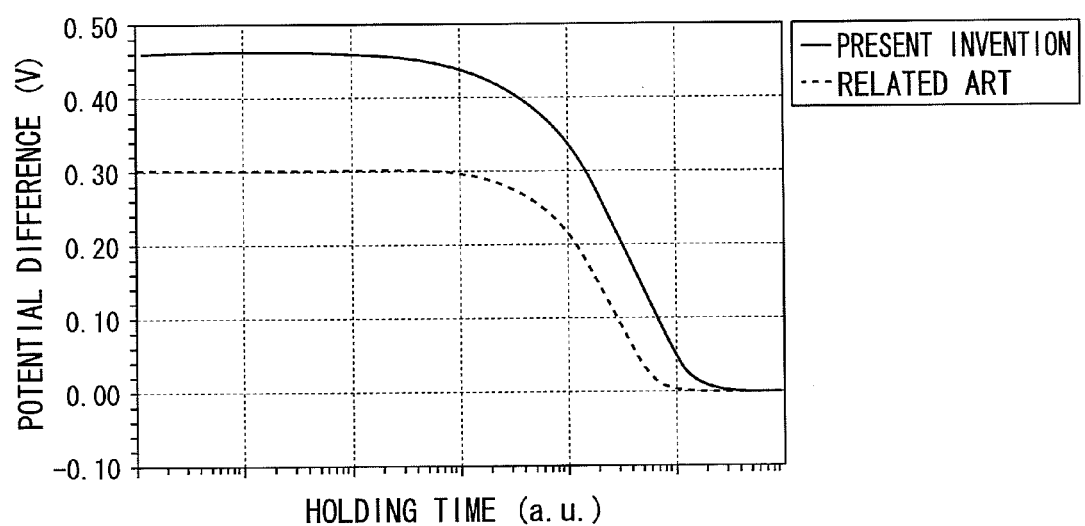
FIG. 23 is a graph illustrating the difference in body potential of each transistor of the semiconductor device 1.

FIG. 23 illustrates the difference in body potentials between a transistor that has written "0" and changes to the data storing state, and a transistor that has written "1" and changes to the data storing state. As the difference in the body potentials is larger, a longer holding time until the refresh operation can be achieved.

According to the semiconductor device 1 of the first embodiment, the body region 101 under the second gate electrode 120 can be used upon storing of data (hole), thereby increasing the amount of electric charges (holes) stored in the body region, compared to the semiconductor device of the related art having the same gate length as that of the first gate electrode 110 of the first embodiment.

Accordingly, the semiconductor device 1 of the first embodiment can maintain the larger difference in the body potentials for a longer time than the semiconductor device of the related art, thereby enhancing the data holding time (refresh characteristics). For this reason, the number of refresh operations can be reduced, thereby achieving DRAM elements with low power consumption.

Second Embodiment

Hereinafter, a semiconductor device 200 according to a second embodiment of the present invention is explained with reference to FIGS. 24A, 24B, and 24C. The second embodiment explains a case where the present invention is applied to a DRAM memory cell including a vertical MOSFET. FIG. 24A is a plan view illustrating a memory cell region. FIG. 24B is a cross-sectional view taken along line B-B' shown in FIG. 24A. FIG. 24C is a cross-sectional view taken along line C-C' shown in FIG. 24A.

The semiconductor device 200 includes, but is not limited to: a first diffusion region (N+ diffusion layer) 549a; a semiconductor layer (active region) 202; a first gate electrode 510; a second gate electrode 520; and a contact plug 557. Hereinafter, each of the elements is explained in detail.

The first diffusion region (N+ diffusion layer) 549a covers a semiconductor board (p-type silicon board) 511. The first diffusion region 549a is made of p-type silicon into which arsenic is diffused at a dose of $1\times10^{15}/cm^2$ to $1\times10^{16}/cm^2$. The first diffusion region 549a functions as a drain diffusion layer of the semiconductor device 200.

The semiconductor layer (active region) 202 includes a body region (p-type silicon layer) 513 and a second diffusion region (n-type diffusion layer) 549b. The semiconductor layer (active region) 202 is surrounded by the second gate insulating film 543 and the first insulating film 527, which penetrate the body region 513 and the second diffusion region 549.

Specifically, the semiconductor layer (active region) 202 has four side surfaces including a first set of opposing side surfaces and a second set of opposing side surfaces. The first set of opposing side surfaces is covered by the second gate insulating film 543. The second set of opposing side surfaces is covered by the first insulating film 527.

The body region (p-type silicon layer) 513 is made of silicon into which boron (B) is diffused at a dose of $1\times10^{15}/cm^3$ to $1\times10^{16}/cm^3$. The body region 513 has a thickness of approximately 300 nm. The body region 513 covers the first diffusion region 549a.

The second diffusion region (n-type diffusion layer) 549b is made of silicon into which phosphorus or arsenic is diffused at a dose of $1\times10^{13}/cm^2$ to $1\times14/cm^2$. The second diffusion region 549b covers an upper surface of the body region 513. The second diffusion region 549b functions as a source diffusion layer of the semiconductor device 200.

Multiple second contact holes (grooves) 502a are formed in the semiconductor layer (active region) 202 so as to penetrate the second diffusion region 549b and the body region 513 and to expose an upper surface of the first diffusion region 549a. A second gate insulating film 543 covers an inner surface of the second contact hole 502a. An upper portion of the second gate insulating film 543 upwardly extends from the second diffusion region 549b. The second gate insulating film 543 is made of, but is not limited to a silicon oxide film.

The first silicon oxide film 515 and the second silicon oxide film 555 are formed so as to cover the upper portion of the second gate insulating film 543, which extends from the second diffusion region 549b.

Multiple second contact holes (grooves) 501a are formed in the semiconductor layer (active region) 202 so as to penetrate the active region 202 and to cross the second contact holes 502a in plan view. The first contact hole 501a is divided by the second contact hole 502a.

A first insulating film 527 is formed so as to fill the first contact hole 501a. The first insulating film 527 includes an insulating film such as a poly-silazane film, a silicon oxide film, and a multi-layered film including these films. A second silicon oxide film 521 is formed so as to cover the inner side surface of the first contact hole 501a and to cover an outer side surface of the first insulating film 527. An upper portion of the second silicon oxide film 521 extends from the second diffusion region 549b.

A top end of the second silicon oxide film 521 is the same in level as a top surface of the first contact hole 501a. A bottom end of the second silicon oxide film 521 is included in the first diffusion region 549a. A silicide layer 525 covers a lower part of the outer side surface of the first insulating film 527. A top end of the silicide layer 525 is in contact with the bottom end of the second silicon oxide film 521, which is included in the first diffusion region 549a. A bottom end of the silicide layer 525 is included in the first diffusion region 549a. The silicide layer 525 is made of a high melting point metal film, such as titanium.

The first silicon oxide film 515 and the second silicon oxide film 555 cover the outer side surface of the upper portion of the second silicon oxide film 521, which upwardly extends from the second diffusion region 549b.

Accordingly, a portion of the first insulating film 527, which extends from the upper surface of the second diffusion region 549b to the bottom surface of the body region 513, is covered by the second silicon oxide film 521. A portion of the first insulating film 527, which extends in the first diffusion region 549a, is covered by the silicide layer 525. A lower portion of the first insulating film 527 is not covered by any insulating film, and is directly connected to the semiconductor board 511, as shown in FIG. 24C.

The semiconductor layer (active region) 202 has a pillar structure surrounded by the second silicon oxide film 521 and the second gate insulating film 543. Accordingly, the two adjacent active regions 202 are separated from each other by the second silicon oxide film 521 and the second gate insulating film 543, as shown in FIG. 24A.

The first gate electrode 510 is made of, for example, a multi-layered film including a titanium nitride (TiN) film and a tungsten (W) film. A height of the first gate electrode 510 from the bottom surface of the second gate insulating film 543 is approximately 100 nm. A poly-silicon film 542 having a thickness of approximately 10 nm is formed on the first gate electrode 510. A third gate insulating film 543a having a thickness of approximately 6 nm is formed on the poly-silicon film 542.

Accordingly, the first gate electrode 510 is disposed over the first diffusion region 549a through the second gate insulating film 543. The first gate electrode 510 is disposed along the periphery of the semiconductor layer (active region) 202.

The first gate electrode 510 is placed adjacent to the body region 513 via the second gate insulating film 543. The bottom and side surfaces of the first gate electrode 510 are covered by the second gate insulating film 543. The upper surface of the first gate electrode 510 is covered by the poly-silicon film 542 and the third insulating film 543a. Thus, the first gate electrode 510 is insulated from peripheral elements.

The second gate electrode 520 is made of, for example, a multi-layered film including a titanium nitride (TiN) film and a tungsten (W) film. A height of the second gate electrode 520 from the upper surface of the third gate electrode 543a is approximately 100 nm.

Accordingly, the second gate electrode 520 is disposed along the periphery of the semiconductor layer (active region) 202. The second gate electrode 520 is placed adjacent to the body region 513 via the second gate insulating film 543. An upper portion of the second gate electrode 520 is placed adjacent to the second diffusion region 549b via the second gate insulating film 543.

A first silicon oxide film 546 is formed over the second gate electrode 520 so as to fill the second contact hole 502a. The first silicon oxide film 546 includes a silicon oxide film having a thickness of approximately 20 nm. Accordingly, the bottom surface, the side surface, and the upper surface of the second electrode 520 are covered by the third gate insulating film 543a, the gate insulating film (second gate insulating film) 543, and the first silicon oxide film 546, respectively. Thus, the second gate electrode 520 is electrically insulated from peripheral elements.

The contact plug 557 is made of silicon into which, for example, phosphorus or arsenic is diffused at a dose of $1 \times 10^{13}/cm^3$ to $1 \times 10^{14}/cm^3$. The contact plug 557 covers the upper surface of the second diffusion region 549b and fills a space between the two adjacent gate insulating films 543. The contact plug 557 is electrically connected to the second diffusion region 549b and functions as a contact plug leading to the source diffusion layer.

A wiring layer (not shown) and a contact plug (not shown) are formed so as to be connected to the first and second gate electrodes 510 and 520, the bit line 501, and the contact plug 557. However, explanations thereof are omitted here.

According to the semiconductor device 200 of the second embodiment, the body region 513 is disposed inside the pillar, and the first diffusion region 549a is disposed under the body region 513. Accordingly, the body region 513 can be in the electrically floating state. For this reason, the SOI substrate 104 is not necessary as the semiconductor device 1 of the first embodiment, thereby enabling miniaturization of the semiconductor device 200.

Although the first and second gate electrodes 510 and 520 are separated from each other, the same operation as that of the first embodiment can be performed by adjusting the thicknesses of the poly-silicon film 542 and the third gate insulating film 543a.

Hereinafter, a method of manufacturing the semiconductor device 200 of the second embodiment is explained with reference to FIGS. 25 to 39. FIGS. 25A to 39A are plane views. FIGS. 25B to 39 B are cross-sectional views taken along line B-B' shown in FIGS. 25A to 39A, respectively. FIGS. 25C to 39C are cross-sectional views taken along line C-C' shown in FIGS. 25A to 39A, respectively.

The method of the second embodiment includes, but is not limited to: a process of forming the first diffusion region 549a; a process of forming the semiconductor layer (active region) 202; a process of forming the first contact hole (groove) 501a; a process of removing the second silicon oxide film 521; a process of forming the first insulating film 527; a process of forming the second contact hole (groove) 502a; a process of forming the first gate electrode 510; a process of forming the second gate electrode 520; a process of forming the second insulating film 551; a process of forming the second diffusion region 549b; and a process of forming the contact plug 557. Hereinafter, each of the processes is explained in detail.

In the process of forming the first diffusion region 549a, arsenic is ion-implanted into the semiconductor board 511 made of p-type silicon, at an energy of 30 keV, at a dose of $1 \times 10^{15}/cm^2$ to $1 \times 10^{16}/cm^2$. Then, a thermal treatment is carried out at a temperature of 1000° C., for 10 seconds. Thus, the high-concentration n-type first diffusion region (N+ diffusion layer) 549a is formed on the semiconductor board 511, as shown in FIGS. 25B and 25C.

Figure 25A:
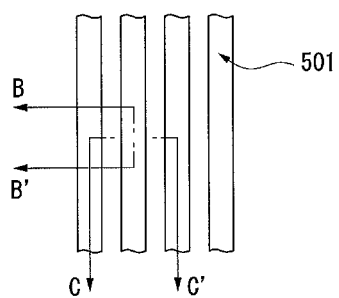
Figure 25B:
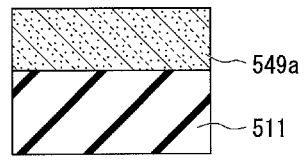
Figure 25C:
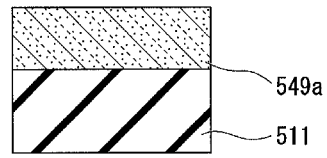

FIG. 25A illustrates positions of bit lines 501 as will be explained later. A vertical MOSFET is disposed between a lower drain diffusion layer and an upper source diffusion layer. Hereinafter, a wiring layer to be connected to the drain diffusion layer is called the bit line 501.

Figure 26A:
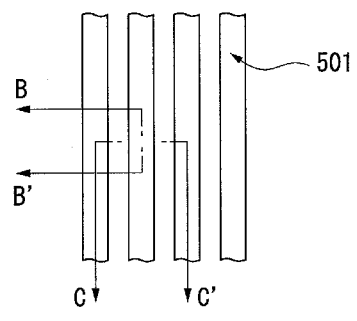
Figure 26B:
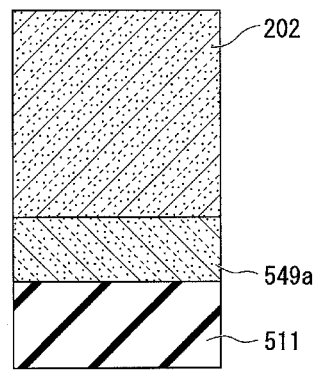
Figure 26C:
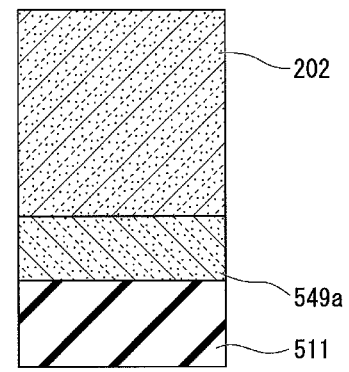

In the process of forming the semiconductor layer (active region) 202, the semiconductor layer (active region) 202 having a thickness of approximately 300 nm is formed by an epitaxial growth method so as to cover the first diffusion region 549a, as shown in FIGS. 26B and 26C. The semiconductor layer (active region) 202 is made of p-type silicon into which boron is introduced at a dose of $1 \times 10^{15}/cm^3$ to $1 \times 10^{16}/cm^3$. Alternatively, a silicon layer free of impurities may be formed first, and then a p-type impurity may be ion-implanted into the silicon layer.

In the process of forming the first contact hole 501a, a first silicon oxide film 515 having a thickness of approximately 10 nm is formed by thermal oxidation on the semiconductor layer (active region) 202. Then, a silicon nitride film 516 having a thickness of, for example, 140 nm is formed by LP-CVD on the first silicon oxide film 515. Then, a photoresist film 517 is formed over the silicon nitride film 516. Then, the photoresist film 517 is patterned by a photolithography technique.

Figure 27A:
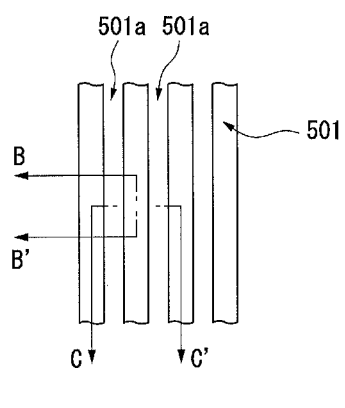
Figure 27B:
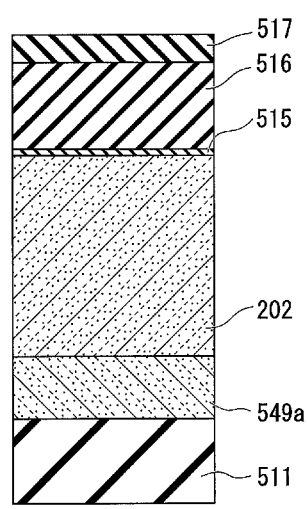
Figure 27C:
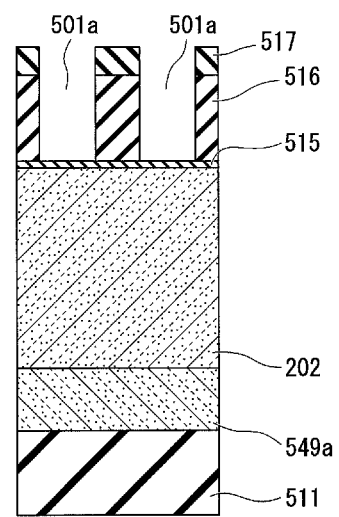

Then, the silicon nitride film 516 is etched using, as a mask, the photoresist film 517. Thus, multiple first contact holes 501a, which penetrate the silicon nitride film 516 and partially expose an upper surface of the first silicon oxide film 515, are formed as shown in FIGS. 27B and 27C.

Accordingly, the photoresist film 517 has a pattern of holes at positions corresponding to those of the first contact holes 501a. The first contact holes 501a extend in parallel as shown in FIG. 27A.

Figure 28A:
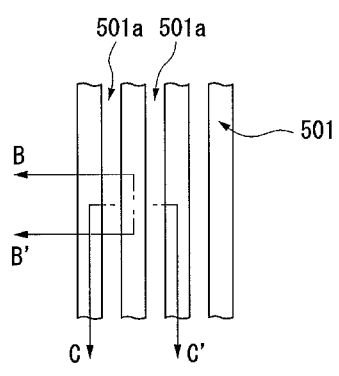
Figure 28B:
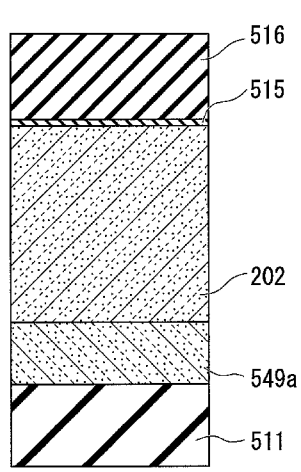
Figure 28C:
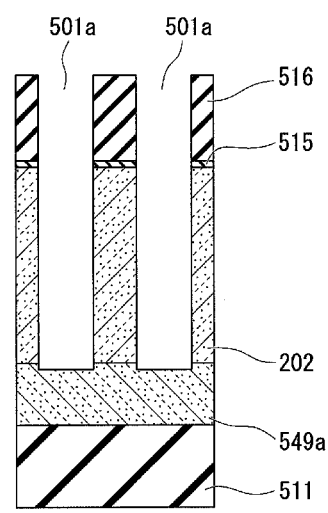

Then, the photoresist film 517 is removed. Then, the first silicon oxide film 515 and the semiconductor layer (active region) 202 are etched using the silicon nitride film 516 as a mask. Thus, an upper surface of the first diffusion region 549a is partially exposed to the first contact hole 501a, as shown in FIG. 28C. In this case, the upper surface of the first diffusion region 549a may be slightly etched. Accordingly, a pattern of the first contact holes 501a is formed as shown in FIG. 28A.

Then, the second silicon oxide film 521 having a thickness of approximately 15 nm is formed by LP-CVD so as to cover an inner surface of the first contact hole 501a and an upper surface of the silicon nitride film 516, as shown in FIG. 29C. In this case, the thickness of the second silicon oxide film 521 is adjusted so that the second silicon oxide film 521 does not completely fill the first contact hole 501a.

Figure 30A:
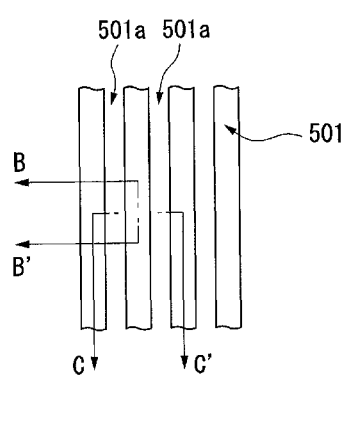
Figure 30B:
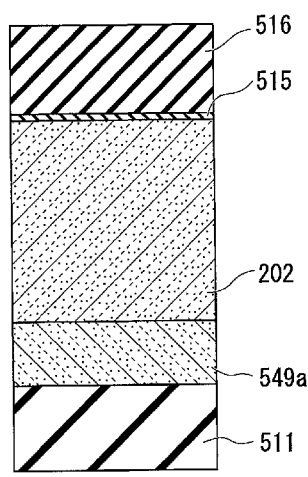
Figure 30C:
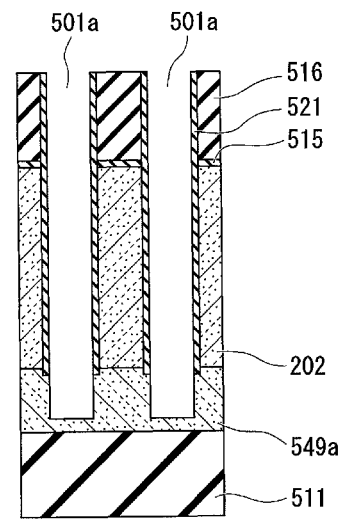

In the process of removing the second oxide film 521, a portion of the second oxide film 521, which covers a bottom surface of the first contact hole 501a, is removed by anisotropic etching, as shown in FIG. 30C. In this case, a condition of the anisotropic etching is adjusted so that the bottom surface of the first contact hole 501a is further lowered in level by approximately 40 nm. Further, the condition is adjusted so that the first contact hole 501a does not completely penetrate the first diffusion region 549a and that the etched bottom surface of the first contact hole 501a is included in the first diffusion region 549a.

Figure 31A:
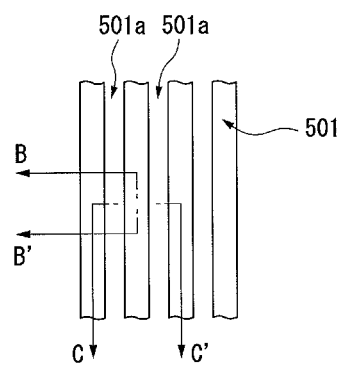
Figure 31B:
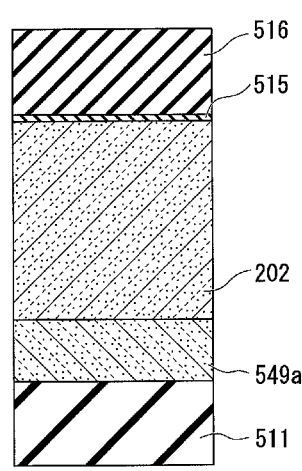
Figure 31C:
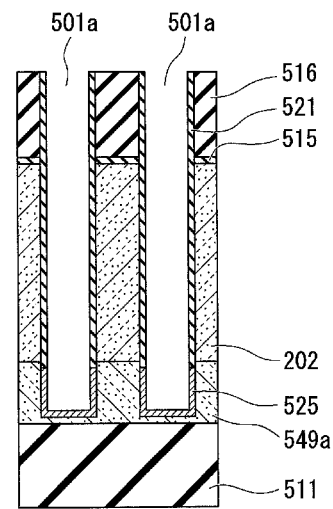

Then, the silicide layer 525 is formed by a siliciding technique so as to cover the inner surface of the first diffusion region 549a, which is exposed to the first contact hole 501a, as shown in FIG. 31C. The silicide layer 525 is made of a high melting point metal, such as titanium. Thanks to the silicide layer 525, a wiring resistance of the bit line 501 can be reduced.

Figure 32A:
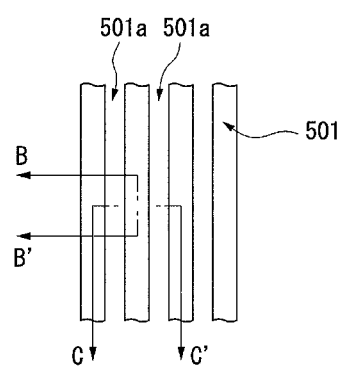
Figure 32B:
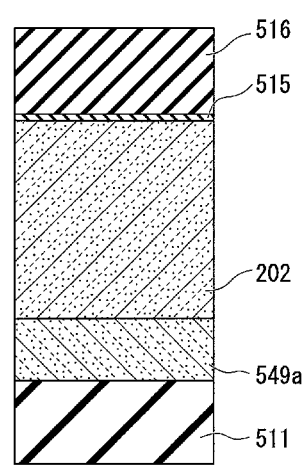
Figure 32C:
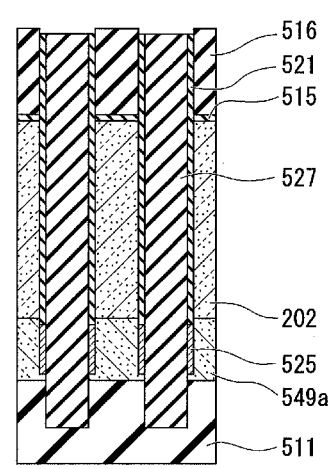

In the process of forming the first insulating film 527, a portion of the silicide layer 525, which covers the bottom surface of the first contact hole 501a, is removed by anisotropic etching. Then, the first diffusion region 549a and the semiconductor board 511 are etched so that the bottom surface of the first contact hole 501a is further lowered in level by approximately 50 nm. Then, the first insulating film 527 is formed so as to cover an upper surface of the silicon nitride film 516 and to fill the first contact hole 501a, as shown in FIG. 32C. In this case, an insulating film such as a polysilazane film, a silicon oxide film formed by HDP-CVD (High Density Plasma-CVD), and a multi-layered film including these films may be used as the material of the first insulating film 527.

Then, the first insulating film 527 is polished by CMP until the upper surface of the silicon nitride film 516 is exposed. Thus, the second diffusion regions 549b are divided by the first insulating film 527, and a pattern of the bit lines 501 is formed as shown in FIG. 32A.

Figure 33A:
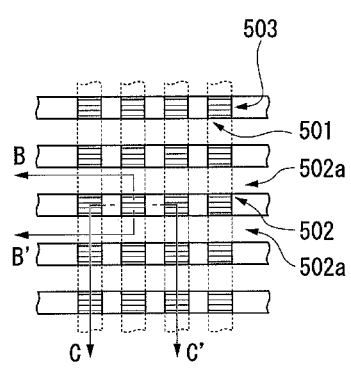

In the process of forming the second contact hole 502a, a photoresist film 531 is formed by photolithography so as to cover the silicon nitride film 516. In this case, the photoresist film 531 has a pattern of openings positioned correspondingly to the second contact holes 502a. The pattern of openings for forming the second contact holes 502a and the pattern of the bit lines 501 are orthogonally crossed, as shown in FIG. 33A.

Figure 33B:
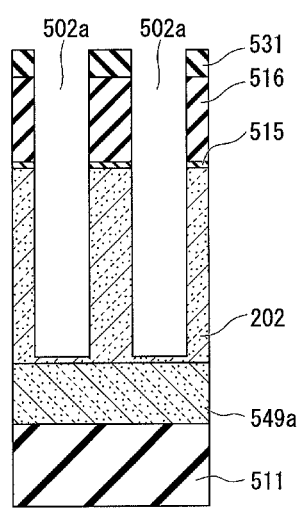
Figure 33C:
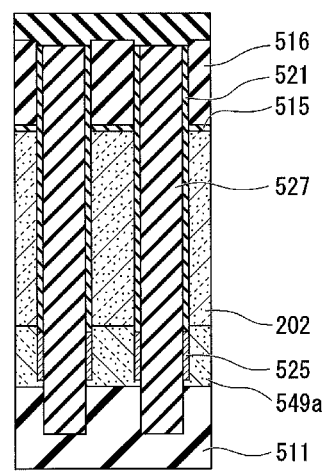

Then, the silicon nitride film 516, the first silicon oxide film 515, and the semiconductor layer (active region) 202 are anisotropically etched using the photoresist film 531 as a mask. Thus, the second contact hole 502a, which penetrates the semiconductor layer (active region) 202 and partially exposes the first diffusion region 549a, is formed, as shown in FIG. 33B. At the same time, multiple silicon pillars 503 are formed, each of which is surrounded by the first contact hole 501a and the second contact hole 502a. After the second contact holes 502a are formed, the photoresist film 531 is removed.

Figure 34A:
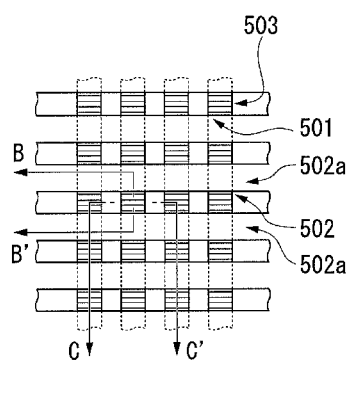
Figure 34B:
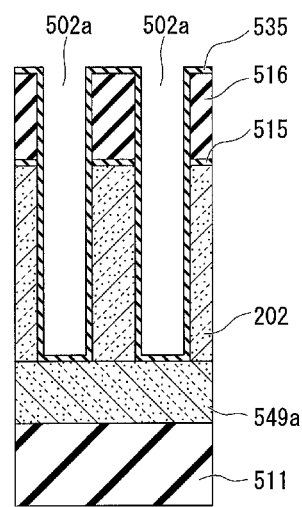
Figure 34C:
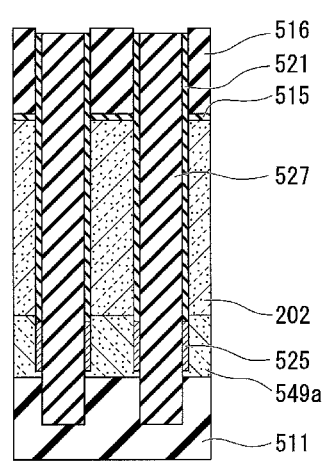

Then, the first gate insulating film 535 having a thickness of approximately 6 nm is formed so as to cover an inner surface of the second contact hole 502a and, an upper surface of a portion of the silicon nitride film 516 which overlaps the word-line pattern 502 in plan view, as shown in FIG. 34B. The first gate insulating film 535 is made of a silicon oxide film and the like.

In the process of forming the first gate electrode 510, a titanium nitride (TiN) film, which has a thickness of approximately 5 nm, is formed as a barrier film, so as to cover the inner surface of the second contact hole 502a. Then, a tungsten (W) film is formed over the titanium nitride film. Then, the multi-layered film is etched so that a height of the multi-layered film from the bottom surface of the second contact hole 502a becomes approximately 100 nm. Thus, the first gate electrode 510 is formed as shown in FIG. 35B.

Then, the poly-silicon film 542 is formed over the first gate electrode 510. Then, the poly-silicon film 542 is etched so that a thickness of the poly-silicon film 542 becomes approximately 10 nm.

Then, a portion of the first gate insulating film 535, which is exposed to the side surface of the second contact hole 502a, is removed by wet etching. Then, the second gate insulating film 543, having a thickness of 6 nm, is formed so as to cover the exposed side surface of the second contact hole 502a. Then, the third gate insulating film 543a, which has a thickness of 6 nm, is formed on the poly-silicon film 542. In this case, a silicon oxide film and the like may be formed by thermal oxidation, as the second gate insulating film 543. Further, in this case, the poly-silicon film 542 may not be completely oxidized upon the thermal oxidation.

In the process of forming the second gate electrode 520, in a similar manner as the first gate electrode 510, a multi-layered film, which includes a titanium nitride film (barrier film) and a tungsten film over the titanium nitride film, is formed so as to cover the inner surface of the second contact hole 502a and to cover the third gate insulating film 543a. The multi-layered film has a height of approximately 100 nm. Thus, the second gate electrode 520 is formed over the first gate electrode 510 through the insulator (the poly-silicon film 542 and the second insulating film 543a), as shown in FIG. 36B.

Then, a silicon oxide film, which has a thickness of approximately 20 nm, is formed by LP-CVD so as to cover the inner side surface of the second contact hole 502a. Then, the silicon oxide film is etched. Thus, the first silicon oxide film 546 covering the inner surface of the second contact hole 502a is formed as shown in FIG. 36B. Then, the second gate electrode 520, the second gate insulating film 543, the poly-silicon film 542, and the first gate electrode 510 are anisotropically etched using the first silicon oxide film 546 as a mask. Thus, a groove 502b is formed so as to penetrate the films 520, 543, 542, 510 at the centers thereof, as shown in FIG. 37B.

Figure 38A:
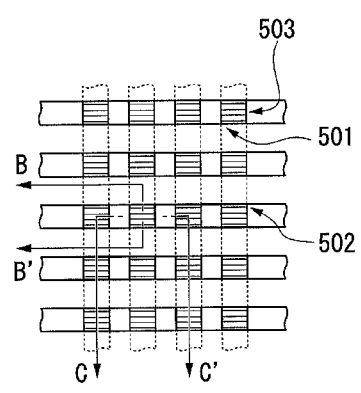
Figure 38B:
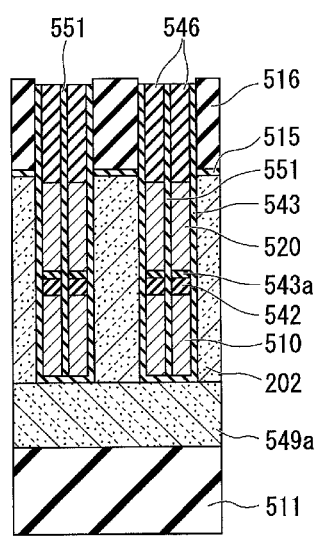
Figure 38C:
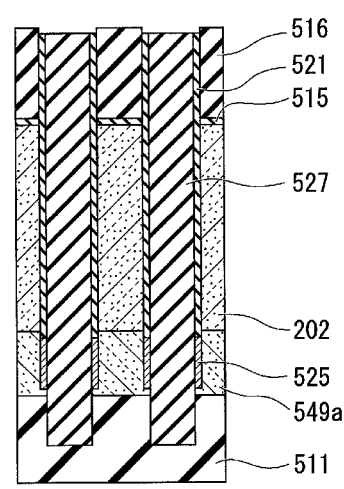

In the process of forming the second insulating film 551, the second insulating film 551, which is made of an insulating film such as a poly-silazane film, is formed so as to fill the groove 502b and to cover the upper surface of the silicon nitride film 516. Then, a portion of the second insulating film 551, which covers the upper surface of the silicon nitride film 516, is removed by dry etching. Thus, the first gate electrode 510 and the second gate electrode 520 are divided into two at the centers thereof by the second insulating film 551, as shown in FIG. 38B.

In the process of forming the second diffusion region 549b, the silicon nitride film 516 is removed by wet etching using a heated phosphoric acid solution. Then, phosphorus or arsenic is ion-implanted into the semiconductor layer (active region) 202 at an energy of 20 keV to 30 keV, at a dose of $1 \times 10^{13}/cm^2$ to $1 \times 10^{14}/cm^2$. Then, a thermal treatment is carried out at a temperature of 950° C., for 10 seconds. Thus, the second diffusion region 549b is formed in the semiconductor layer (active region) 202, adjacent to the upper surface of the semiconductor layer (active region) 202, as shown in FIG. 39B. The second diffusion region 549b is placed adjacent to the second gate electrode 520 via the second gate insulating film 543.

In this case, the second diffusion region 549b is formed at the position of the silicon pillar 503, as shown in FIG. 39A. The second diffusion region 549b functions as the source diffusion layer of the semiconductor device 200 as will be explained later.

Then, the second silicon oxide film 555 is formed so as to cover the outer side surface of a portion of the second gate insulating film 543, which extends from the first silicon oxide film 515. The second silicon oxide film 555 upwardly extends from the upper surface of the first silicon oxide film 515.

In the process of forming the contact plug 557, a portion of the first silicon oxide film 515, which covers the second diffusion region 549b, is removed by dry etching. Then, a poly-silicon film, into which phosphorus is doped at a dose of approximately $1\times10^{20}/cm^3$, is formed over the second diffusion region 549b. Then, CMP is carried out until the upper surface of the first silicon oxide film 546 is exposed. Thus, the contact plug 557 is formed as shown in FIG. 24B. The contact plug 557 is electrically connected to the second diffusion region 549b and functions as a contact plug leading to the source diffusion layer.

Then, a wiring layer (not shown) and a contact plug (not shown) are formed so as to be connected to the first and second gate electrodes 510 and 520, the bit line 501, and the contact plug 557. In this case, the bit line 501 and the contact plug 557 can apply voltages to the first and second diffusion regions 549a and 549b, respectively. Thus, the semiconductor device 200 of the second embodiment is formed as shown in FIGS. 24A, 24B, and 24C.

According to the semiconductor device 200 of the second embodiment, a set of opposing side surfaces of the silicon pillar 503 are covered by the first gate electrodes 510 to which the same voltage can be simultaneously applied, as shown in FIGS. 24A, 24B, and 24C. Additionally, the same set of opposing side surfaces of the silicon pillar 503 are covered by the second gate electrodes 520 to which the same voltage can be simultaneously applied, as shown in FIGS. 24A, 24B, and 24C. Accordingly, the semiconductor device 200 can achieve larger capacitance.

Additionally, an inversion layer can be formed in the body region 513, which is adjacent to the first gate electrode 510 via the gate insulating film, by applying a voltage to the first gate electrode 510, similarly to the first embodiment. Accordingly, the effective base length can be shortened upon a bipolar operation. Therefore, a bipolar current can be made to flow easily by applying a small drain voltage, thereby stabilizing memory operations of the semiconductor device 200.

Further, potentials of the first and second gate electrodes 510 and 520 are set to be lower than that of the second diffusion region 549b when the semiconductor device 200 performs storing of data, and thus the entire body region 513 can be used for storing an electric charge (hole). Accordingly, a greater amount of holes can be stored, thereby enabling a longer charge holding time, and therefore enabling an increase in the refresh characteristics of the semiconductor device 200. If the gate length is increased in the semiconductor structure of the related art, the bipolar current decreases during the on-operation. On the other hand, such a decrease in the bipolar current can be prevented in the second embodiment of the present invention.

Moreover, the first and second gate electrodes are vertically stacked, thereby preventing an increase in the occupied areas of the memory cell. Additionally, an impurity diffusion layer (first and second diffusion region 549a and 549b) does not have to be formed between the first and second gate electrodes 510 and 520, thereby enabling higher integration of semiconductor devices.

As used herein, the following directional terms "forward," "rearward," "above," "downward," "vertical," "horizontal," "below," and "transverse," as well as any other similar directional terms refer to those directions of an apparatus equipped with the present invention. Accordingly, these terms, as utilized to describe the present invention should be interpreted relative to an apparatus equipped with the present invention.

The terms of degree such as "substantially," "about," and "approximately" as used herein mean a reasonable amount of deviation of the modified term such that the end result is not significantly changed. For example, these terms can be construed as including a deviation of at least ±5 percent of the modified term if this deviation would not negate the meaning of the word it modifies.

It is apparent that the present invention is not limited to the above embodiments, and may be modified and changed without departing from the scope and spirit of the invention.

In addition, while not specifically claimed in the claim section, the application reserves the right to include in the claim section at any appropriate time the following semiconductor device and method.

A semiconductor device may include, but is not limited to: a first diffusion layer on the semiconductor substrate, the first diffusion layer having a first conductive type; a columnar semiconductor layer on the first diffusion layer, the columnar semiconductor layer having a second conductive type which is different from the first conductive type; a first gate electrode disposed facing to a part of a side surface of the columnar semiconductor layer with an intervention of a first insulating film therebetween; a second gate electrode disposed facing to another part of the side surface of the columnar semiconductor layer with an intervention of a second insulating film therebetween; and a second diffusion layer on an upper surface of the columnar semiconductor layer, the second diffusion layer having the first conductive type, wherein the second gate electrode is disposed over the first gate electrode, a bottom surface of the second gate electrode being faced to an upper surface of the first gate electrode with an intervention of a third insulating film therebetween.

A method of manufacturing a semiconductor device may include, but is not limited to: forming an active region on a substrate, the active region having a first conductive type; forming a first electrode on the active region; forming a first insulating film covering a surface of the first electrode; forming a second electrode such as located partially overlapping the first electrode in plan view; and forming a first diffusion layer and a second diffusion layer on the active region, the first and the second diffusion layers having the second conductive type which is different from the first conductive type, and the first and the second electrodes being disposed between the first diffusion layer and the second diffusion layer in plan view.

What is claimed is:

1. A semiconductor device comprising:
   a first insulating film;
   first and second impurity layers on the first insulating film, the first and second impurity layers having a first conductive type, and the first impurity layer being separated from the second impurity layer;
   a semiconductor layer on the first insulating film, the semiconductor layer being positioned between the first and second impurity layers, the semiconductor layer having a second conductive type which is different from the first conductive type;
   a second insulating film covering the semiconductor layer;
   a first electrode on the second insulating film over the semiconductor layer; and
   a second electrode on the second insulating film over the semiconductor layer, the first electrode being electrically insulated from the second electrode, and the second electrode at least partially overlapping the first electrode in plan view.

2. The semiconductor device according to claim 1, further comprising:

a third insulating film covering a side surface of the first electrode; and a fourth insulating film covering a side surface of the second electrode.

3. The semiconductor device according to claim 2, further comprising:

a fifth insulating film covering the third and fourth insulating films, and a part of an upper surface of the first electrode, wherein an upper surface of the second electrode is positioned at higher level than the upper surface of the first electrode.

4. The semiconductor device according to claim 1, wherein the first electrode comprises a metal film and a sixth insulating film over the metal film.

5. The semiconductor device according to claim 1, further comprising:

third and fourth impurity layers in the semiconductor layer, the third and fourth impurity layers having the first conductive type, the third impurity layer being adjacent to the first impurity layer, and the fourth impurity layer being adjacent to the second impurity layer.

6. The semiconductor device according to claim 5, wherein the first and second impurity layers have first impurity concentration, and the third and fourth impurity layers have second impurity concentration, the second impurity concentration being lower than the first impurity concentration.

7. The semiconductor device according to claim 3, further comprising:

a first silicide layer covering an upper surface of the first impurity layer;

a second silicide layer covering an upper surface of the second impurity layer;

a third silicide layer covering the upper surface of the second electrode;

a first contact plug connected to the first silicide layer; and a second contact plug connected to the second silicide layer.

8. A method of controlling a semiconductor device, the semiconductor device comprising: a first insulating film; first and second impurity layers on the first insulating film, the first and second impurity layers having a first conductive type, and the first impurity layer being separated from the second impurity layer; a semiconductor layer on the first insulating film, the semiconductor layer being positioned between the first and second impurity layers, the semiconductor layer having a second conductive type which is different from the first conductive type; a second insulating film covering the semiconductor layer; a first electrode on the second insulating film over the semiconductor layer; and a second electrode on the second insulating film over the semiconductor layer, the first electrode being electrically insulated from the second electrode, and the second electrode at least partially overlapping the first electrode in plan view, and the method comprising:

in case of writing a data to the semiconductor device or reading a data from the semiconductor device, applying a first voltage to the first electrode, and applying a second voltage to the second electrode, the first voltage and the second voltage being different.

9. The method according to claim 8, further comprising:

in case of writing "1" data to the semiconductor device, applying a reference voltage to the second impurity layer;

applying a third voltage to the first impurity layer, the third voltage being higher than the reference voltage;

setting the first voltage of the first electrode to same as the third voltage; and setting the second voltage of the second electrode to a level between the reference voltage and the third voltage.

10. The method according to claim 8, further comprising:

in case of writing "0" data to the semiconductor device, applying a reference voltage to the second impurity layer;

applying a third voltage to the first impurity layer, the third voltage being higher than the reference voltage;

setting the first voltage of the first electrode to a lower level than the reference voltage; and setting the second voltage of the second electrode to same as the reference voltage.

11. The method according to claim 8, further comprising:

in case of reading data from the semiconductor device, applying a reference voltage to the second impurity layer;

applying a third voltage to the first impurity layer, the third voltage being higher than the reference voltage;

setting the first voltage of the first electrode to same as the third voltage; and setting the second voltage of the second electrode to a lower level than the reference voltage.

12. The method according to claim 8, further comprising:

in case of keeping data written to the semiconductor device, applying a reference voltage to the second impurity layer;

applying a fourth voltage to the first impurity layer, the fourth voltage being same as the reference voltage;

setting the first voltage of the first electrode to a lower level than the reference voltage; and setting the second voltage of the second electrode to same as the first voltage of the first electrode.

13. The method according to claim 9, wherein the reference voltage is zero volt.

14. The method according to claim 10, wherein the reference voltage is higher than zero volt.

15. The method according to claim 11, wherein the reference voltage is zero volt.

16. The method according to claim 12, wherein the reference voltage is zero volt.

17. The method according to claim 8, further comprising:

in case of reading data from the semiconductor device, setting the first voltage of the first electrode such as forming an inversion layer in the semiconductor layer; and setting the second voltage of the second electrode such as flowing a bipolar current between the second impurity layer and the inversion layer.

* * * * *